US012620258B2

(12) United States Patent
Yamazaki et al.

(10) Patent No.: US 12,620,258 B2
(45) Date of Patent: *May 5, 2026

(54) DISPLAY DEVICE, DISPLAY MODULE, AND ELECTRONIC DEVICE

(71) Applicant: Semiconductor Energy Laboratory Co., Ltd., Atsugi (JP)

(72) Inventors: Shunpei Yamazaki, Setagaya (JP); Shingo Eguchi, Atsugi (JP); Daisuke Kubota, Atsugi (JP); Koji Kusunoki, Isehara (JP); Kazunori Watanabe, Machida (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/910,164

(22) Filed: Oct. 9, 2024

(65) Prior Publication Data

US 2025/0031549 A1      Jan. 23, 2025

Related U.S. Application Data

(63) Continuation of application No. 18/021,024, filed as application No. PCT/IB2021/057924 on Aug. 31, 2021, now Pat. No. 12,150,367.

(30) Foreign Application Priority Data

Sep. 11, 2020      (JP) ................................. 2020-152939

(51) Int. Cl.
G06V 40/13          (2022.01)
H04M 1/02          (2006.01)
(Continued)

(52) U.S. Cl.
CPC ...... *G06V 40/1318* (2022.01); *H04M 1/0264* (2013.01); *H10K 39/34* (2023.02);
(Continued)

(58) Field of Classification Search
CPC .............. H10K 59/40; H10K 59/8792; H10K 59/8722; H10K 59/873; H10K 59/871
See application file for complete search history.

(56) References Cited

U.S. PATENT DOCUMENTS 10,388,706 B2    8/2019  Lee et al.
10,727,285 B2    7/2020  Chung et al.
(Continued)

FOREIGN PATENT DOCUMENTS

CN        105304673 A      2/2016
CN        108573995 A      9/2018
(Continued)

OTHER PUBLICATIONS

Taiwanese Office Action (Application No. 110132242) dated Feb. 14, 2025.
(Continued)

*Primary Examiner* — Joseph R Haley
(74) *Attorney, Agent, or Firm* — Eric J. Robinson; Robinson Intellectual Property Law Office, P.C.

(57)          ABSTRACT

A display device having both a touch detection function and a function of capturing an image of a shape of a fingerprint or a vein is provided. The display device includes a first substrate, a first light-emitting element, a second light-emitting element, a light-receiving element, a light-blocking layer, a first resin layer, and a second resin layer. The first light-emitting element and the light-receiving element are arranged over the first substrate, and the first resin layer is provided over the first light-emitting element and the light-receiving element. The light-blocking layer is provided over
(Continued)

the first resin layer, and the second light-emitting element is provided over the light-blocking layer. The second resin layer is provided over the second light-emitting layer. The first light-emitting element emits visible light upward, and the second light-emitting element emits invisible light upward. The light-receiving element is a photoelectric conversion element having sensitivity to visible light and invisible light. In a plan view, the light-blocking layer includes a portion positioned between the first light-emitting element and the light-receiving element, and the second light-emitting element overlaps with the light-blocking layer and is positioned inside the outline of the light-blocking layer.

14 Claims, 19 Drawing Sheets

(51) Int. Cl.
| | |
|---|---|
| *H10K 39/34* | (2023.01) |
| *H10K 59/40* | (2023.01) |
| *H10K 59/80* | (2023.01) |

(52) U.S. Cl.
CPC ......... *H10K 59/40* (2023.02); *H10K 59/8792* (2023.02); *H10K 59/871* (2023.02); *H10K 59/8722* (2023.02); *H10K 59/873* (2023.02)

(56) References Cited

U.S. PATENT DOCUMENTS

| | | | |
|---|---|---|---|
| 10,978,523 | B2 | 4/2021 | Park et al. |
| 10,985,220 | B2 | 4/2021 | Lee et al. |
| 11,469,277 | B2 | 10/2022 | Chung et al. |
| 11,716,892 | B2 | 8/2023 | Park et al. |
| 11,789,568 | B2 | 10/2023 | Kubota et al. |
| 12,058,878 | B2 | 8/2024 | Yamazaki et al. |
| 12,096,659 | B2 | 9/2024 | Kamada et al. |
| 12,099,686 | B2 | 9/2024 | Kubota et al. |
| 2014/0056493 | A1 | 2/2014 | Gozzini |
| 2015/0364527 | A1 | 12/2015 | Wang et al. |
| 2017/0278909 | A1 | 9/2017 | Jeon et al. |
| 2017/0337413 | A1 | 11/2017 | Bhat et al. |
| 2018/0239942 | A1 | 8/2018 | Xu et al. |
| 2018/0261655 | A1 | 9/2018 | Lee et al. |
| 2019/0013368 | A1 | 1/2019 | Chung et al. |
| 2019/0346939 | A1 | 11/2019 | Na et al. |
| 2020/0083302 | A1 | 3/2020 | Park et al. |
| 2020/0105841 | A1 | 4/2020 | Bang et al. |
| 2020/0133414 | A1 | 4/2020 | Lee et al. |
| 2022/0012450 | A1 | 1/2022 | Miyasaka et al. |
| 2022/0029121 | A1 | 1/2022 | Yamazaki et al. |
| 2022/0067340 | A1* | 3/2022 | Han ..................... G06F 3/042 |
| 2023/0309364 | A1 | 9/2023 | Yamazaki et al. |
| 2024/0397741 | A1 | 11/2024 | Yamazaki et al. |
| 2024/0397755 | A1 | 11/2024 | Kamada et al. |
| 2025/0013333 | A1 | 1/2025 | Kubota et al. |

FOREIGN PATENT DOCUMENTS

| | | |
|---|---|---|
| CN | 109216421 A | 1/2019 |
| CN | 110970475 A | 4/2020 |
| CN | 111129076 A | 5/2020 |
| EP | 3373355 A | 9/2018 |
| EP | 3425670 A | 1/2019 |
| EP | 3637472 A | 4/2020 |
| JP | 2018-147877 A | 9/2018 |
| JP | 2019-033071 A | 2/2019 |
| JP | 2020-092080 A | 6/2020 |
| KR | 2015-0142816 A | 12/2015 |
| KR | 2018-0103206 A | 9/2018 |
| KR | 2019-0004678 A | 1/2019 |
| KR | 2020-0037653 A | 4/2020 |
| KR | 2020-0049959 A | 5/2020 |
| TW | 202029549 | 8/2020 |
| TW | 202033054 | 9/2020 |
| WO | WO-2020/053692 | 3/2020 |
| WO | WO-2020/128735 | 6/2020 |

OTHER PUBLICATIONS

International Search Report (Application No. PCT/IB2021/057924) Dated Oct. 26, 2021.
Written Opinion (Application No. PCT/IB2021/057924) Dated Oct. 26, 2021.

* cited by examiner

100

50

23

52

21
22

51

50

76a

75a 71   71     · · · GLa 71   72     · · ·     CL

SLa     WL     51

77

78

50

76b

75b 73   73     · · · GLb 73   73     · · ·

SLb               52

280A

280B

FIG. 8A
FIG. 8B
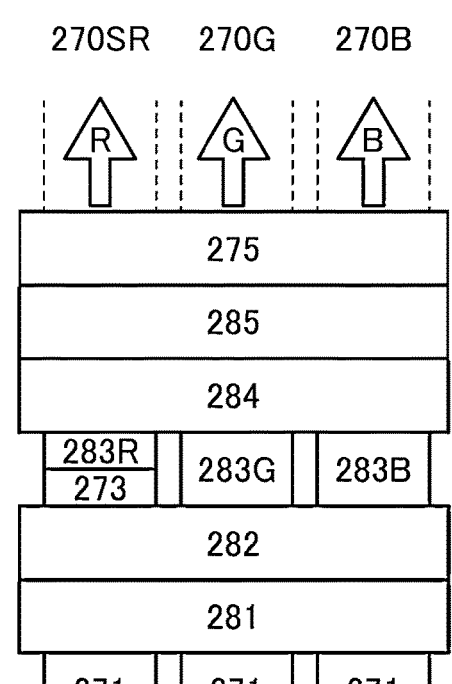
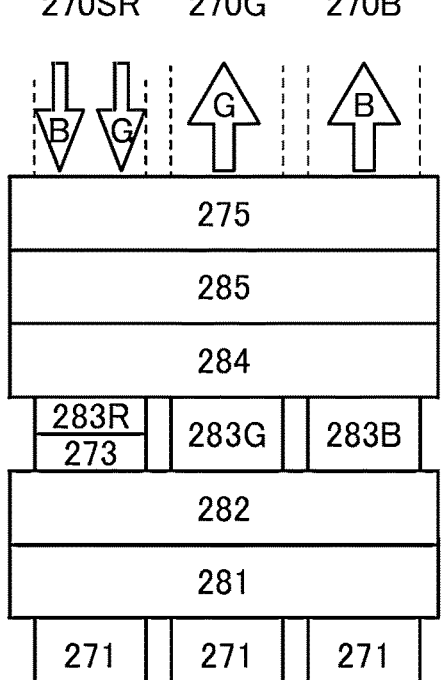
FIG. 8C    FIG. 8D    FIG. 8E    FIG. 8F    FIG. 8G
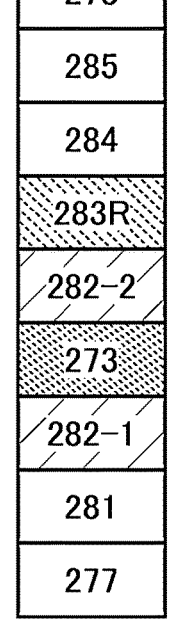

FIG. 11A
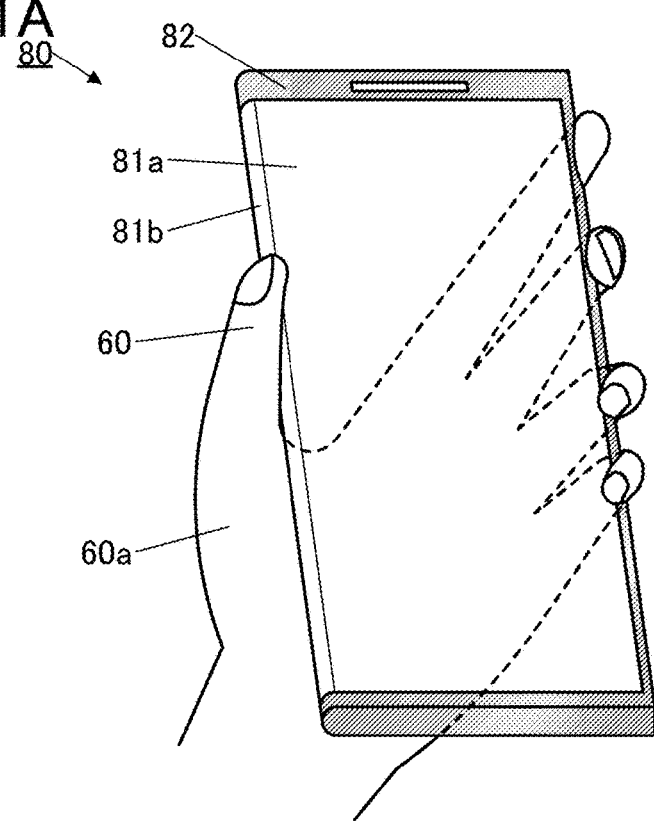
FIG. 11B
FIG. 11C
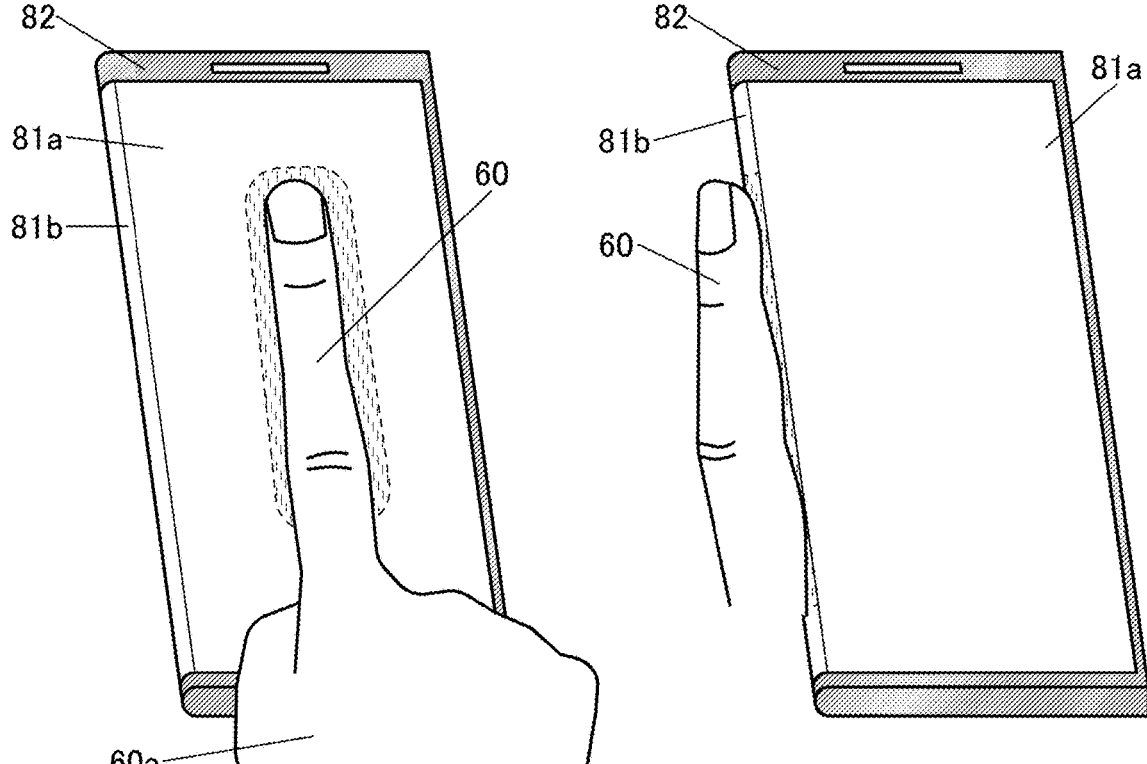

FIG. 18A
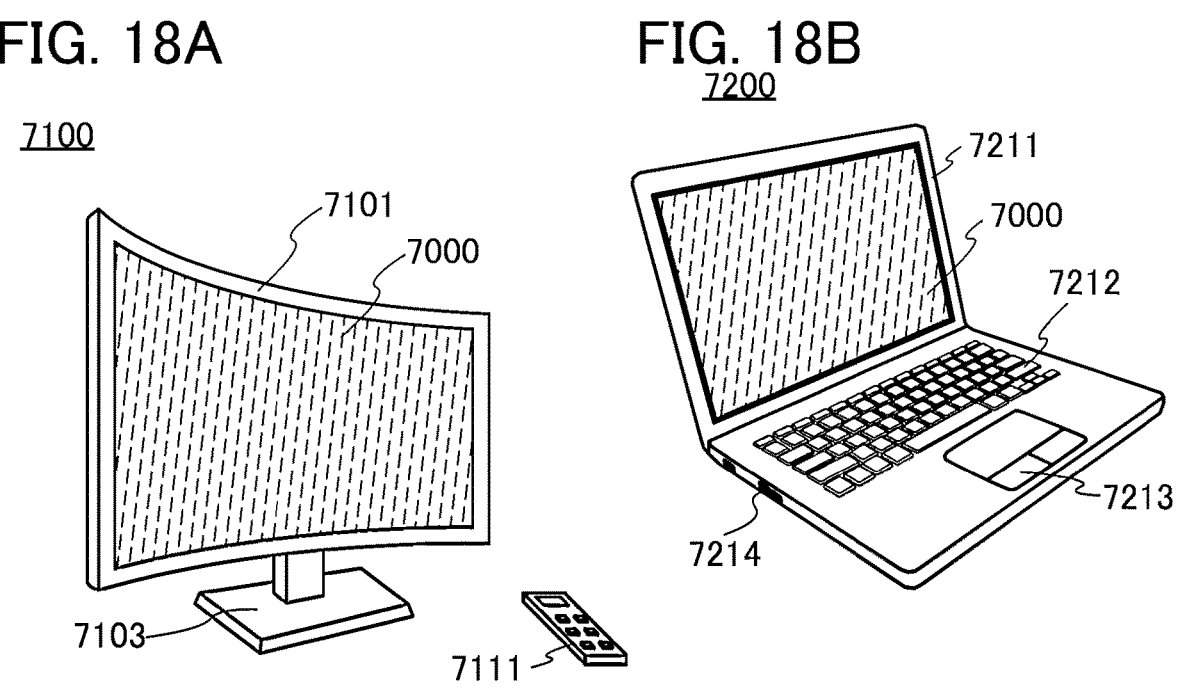
FIG. 18B
FIG. 18C
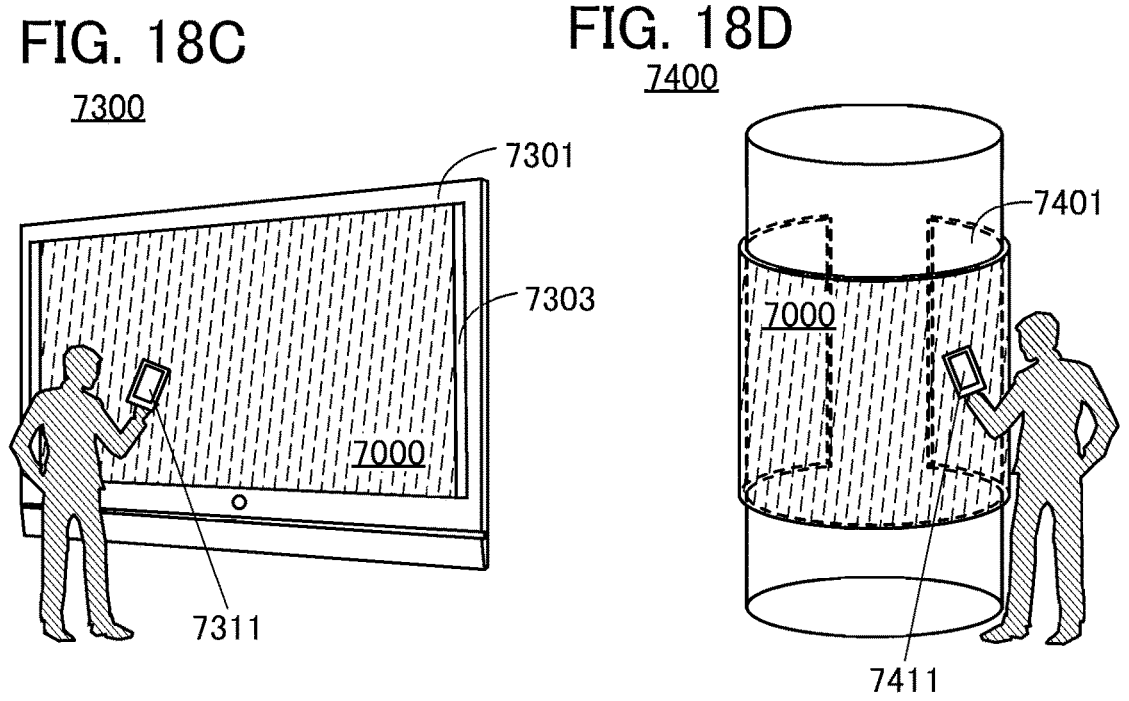
FIG. 18D

FIG. 19A
9101
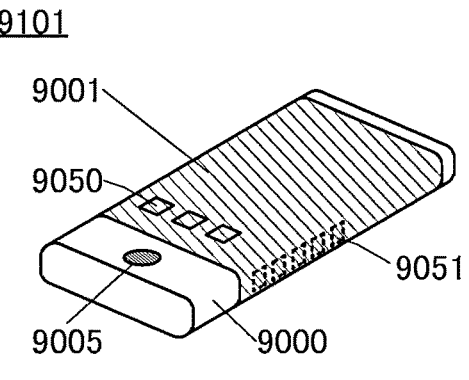
FIG. 19C
9200
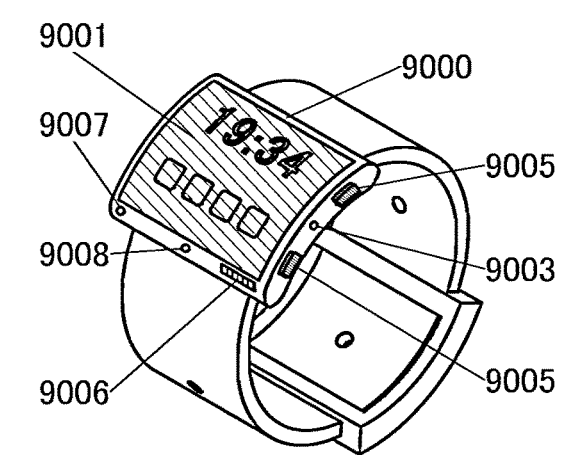
FIG. 19B
9102
FIG. 19D
9201
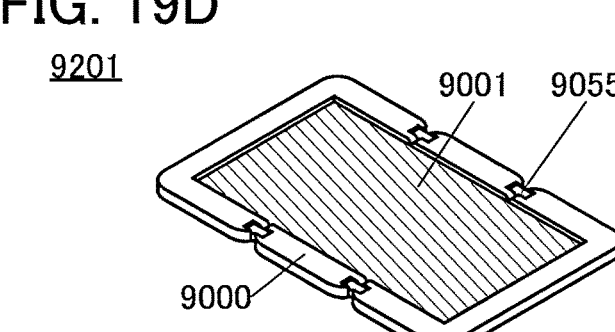
FIG. 19E
9201
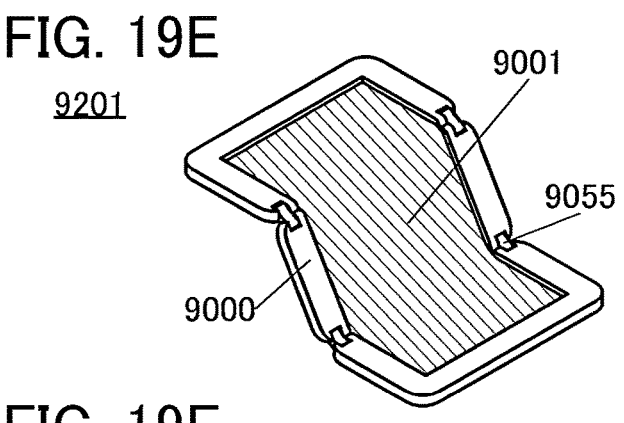
FIG. 19F
9201
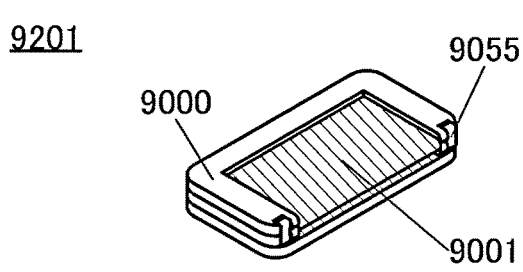

DISPLAY DEVICE, DISPLAY MODULE, AND ELECTRONIC DEVICE

TECHNICAL FIELD

One embodiment of the present invention relates to a display device. One embodiment of the present invention relates to an image capturing device. One embodiment of the present invention relates to a touch panel.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

In recent years, information terminal devices, for example, mobile phones such as smartphones, tablet information terminals, and laptop PCs (personal computers) have been widely used. Such information terminal devices often include personal information or the like, and thus various authentication technologies for preventing unauthorized use have been developed.

For example, Patent Document 1 discloses an electronic device including a fingerprint sensor in a push button switch portion.

REFERENCE

Patent Document

[Patent Document 1] United States Published Patent Application No. 2014/0056493

SUMMARY OF THE INVENTION

Problems to be Solved by the Invention

In the case where a function of authentication such as fingerprint authentication is added to an electronic device functioning as a portable information terminal device, the electronic device needs to include a module for capturing a fingerprint image. This increases the number of components and therefore increases the cost of the electronic device.

An object of one embodiment of the present invention is to reduce the cost of an electronic device having an authentication function. Another object is to reduce the number of components of an electronic device. Another object is to provide a display device capable of capturing an image of a shape of a fingerprint or a vein. Another object is to provide a display device having both a touch detection function and a function of capturing an image of a shape of a fingerprint or a vein. Another object is to provide an electronic device with a high screen occupancy rate which has a function of biometric authentication. Another object is to provide a display device capable of emitting both visible light and infrared light. Another object is to provide an image capturing device capable of capturing an image using both visible light and infrared light as light sources.

An object of one embodiment of the present invention is to provide a display device, an image capturing device, an electronic device, or the like that has a novel structure. An object of one embodiment of the present invention is to at least reduce at least one of problems of the conventional technique.

Note that the description of these objects does not preclude the existence of other objects. One embodiment of the present invention does not have to achieve all of these objects. Objects other than these can be derived from the description of the specification, the drawings, the claims, and the like.

Means for Solving the Problems

One embodiment of the present invention is a display device including a first substrate, a first light-emitting element, a second light-emitting element, a light-receiving element, a light-blocking layer, a first resin layer, and a second resin layer. The first light-emitting element and the light-receiving element are arranged over the first substrate. The first resin layer is provided over the first light-emitting element and the light-receiving element. The light-blocking layer is provided over the first resin layer. The second light-emitting element is provided over the light-blocking layer. The second resin layer is provided over the second light-emitting element. The first light-emitting element has a function of emitting visible light upward. The second light-emitting element has a function of emitting invisible light upward. The light-receiving element is a photoelectric conversion element having sensitivity to the visible light and the invisible light. In a plan view, the light-blocking layer includes a portion positioned between the first light-emitting element and the light-receiving element. In the plan view, the second light-emitting element overlaps with the light-blocking layer and is positioned inside an outline of the light-blocking layer.

In the above, it is preferable that the invisible light be light having intensity in a wavelength range of greater than or equal to 750 nm and less than or equal to 900 nm.

In any of the above, a protective layer is preferably further included. In this case, it is preferable that the protective layer contain an inorganic insulating material and be positioned between the first resin layer and the first light-emitting element and the light-receiving element.

In any of the above, the first light-emitting element preferably includes a first pixel electrode, a first light-emitting layer, and a first electrode. The light-receiving element preferably includes a second pixel electrode, an active layer, and the first electrode. In this case, the first light-emitting layer and the active layer preferably contain different organic compounds from each other. The first electrode preferably includes a portion overlapping with the first pixel electrode with the first light-emitting layer therebetween and a portion overlapping with the second pixel electrode with the active layer therebetween. The first pixel electrode and the second pixel electrode preferably contain the same conductive material.

In any of the above, the second light-emitting element preferably includes a third pixel electrode, a second light-emitting layer, and a second electrode. In this case, the second electrode preferably has a light-transmitting property with respect to the invisible light. In addition, the second electrode is preferably positioned inside the outline of the light-blocking layer in the plan view.

Alternatively, the second electrode preferably has a light-transmitting property with respect to the visible light and the invisible light. The second electrode preferably includes a portion overlapping with the light-blocking layer with the second light-emitting layer and the third pixel electrode therebetween, a portion overlapping with the first light-emitting element, and a portion overlapping with the light-receiving element in the plan view.

Another embodiment of the present invention is a display module including any of the above-described display devices, and a connector or an integrated circuit.

Another embodiment of the present invention is an electronic device including the above-described display module and at least one of an antenna, a battery, a housing, a camera, a speaker, a microphone, a touch sensor, and an operation button. The electronic device preferably has a first image capturing function of receiving first reflective light by the light-receiving element when the visible light is emitted by the first light-emitting element, and a second image capturing function of receiving second reflective light by the light-receiving element when the invisible light is emitted by the second light-emitting element.

Effect of the Invention

According to one embodiment of the present invention, the cost of an electronic device having an authentication function can be reduced. The number of components of an electronic device can be reduced. A display device capable of capturing an image of a shape of a fingerprint or a vein can be provided. A display device having both a touch detection function and a function of capturing an image of a shape of a fingerprint or a vein can be provided. An electronic device with a high screen occupancy rate which has a function of biometric authentication can be provided. A display device or the like capable of emitting both visible light and infrared light can be provided. An image capturing device or the like capable of capturing an image using both visible light and infrared light can be provided.

According to one embodiment of the present invention, a display device, an image capturing device, an electronic device, or the like that has a novel structure can be provided. According to one embodiment of the present invention, at least one of problems of the conventional technique can be reduced.

Note that the description of these effects does not preclude the existence of other effects. One embodiment of the present invention does not have to have all of these effects. Effects other than these can be derived from the description of the specification, the drawings, the claims, and the like.

BRIEF DESCRIPTION OF THE DRAWINGS

FIG. 8A to FIG. 8G are diagrams illustrating structure examples of display devices.

4

Figure 9:
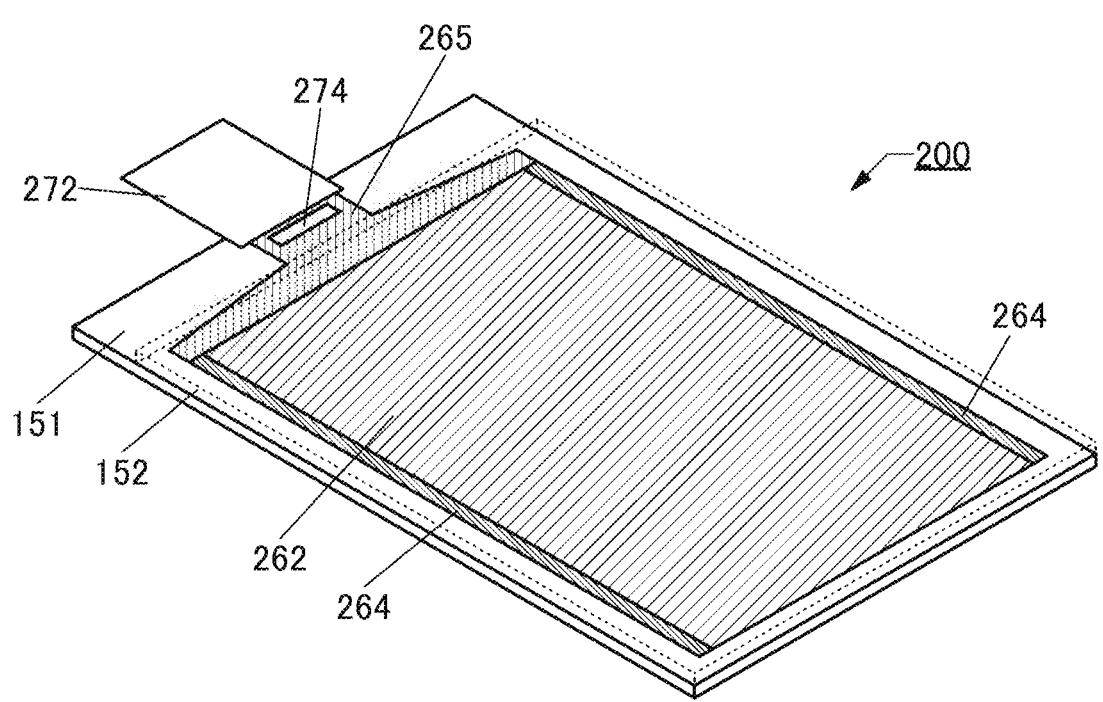

FIG. 9 is a diagram illustrating a structure example of a display device.

Figures 10A, 10B:
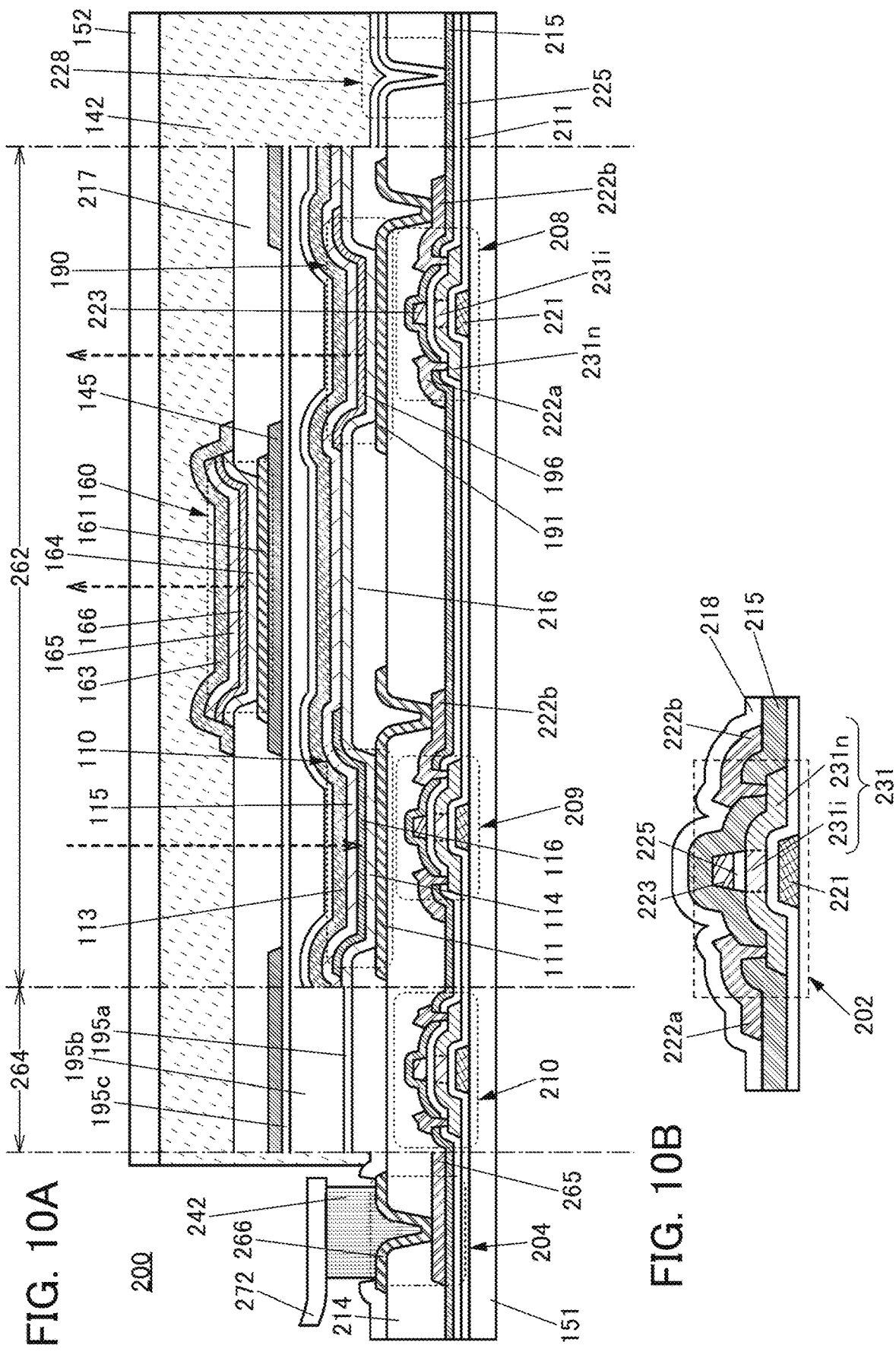

FIG. 10A is a diagram illustrating a structure example of a display device. FIG. 10B is a diagram illustrating a structure example of a transistor.

FIG. 11A to FIG. 11C are diagrams illustrating a structure example of an electronic device.

Figure 12:
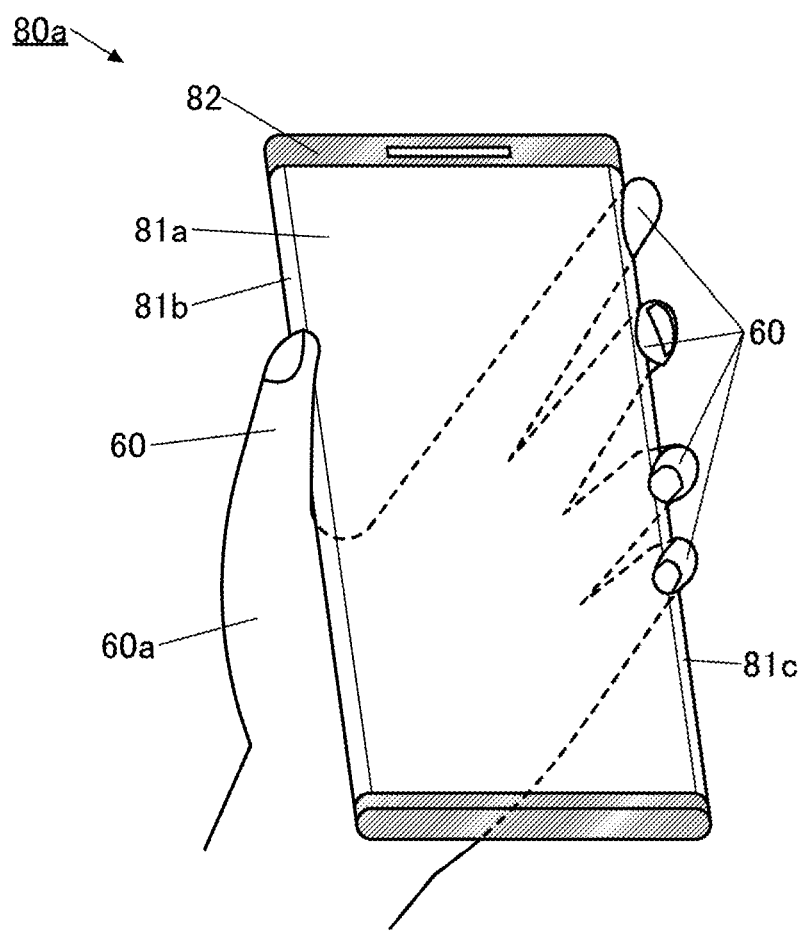

FIG. 12 is a diagram illustrating a structure example of an electronic device.

Figure 13:
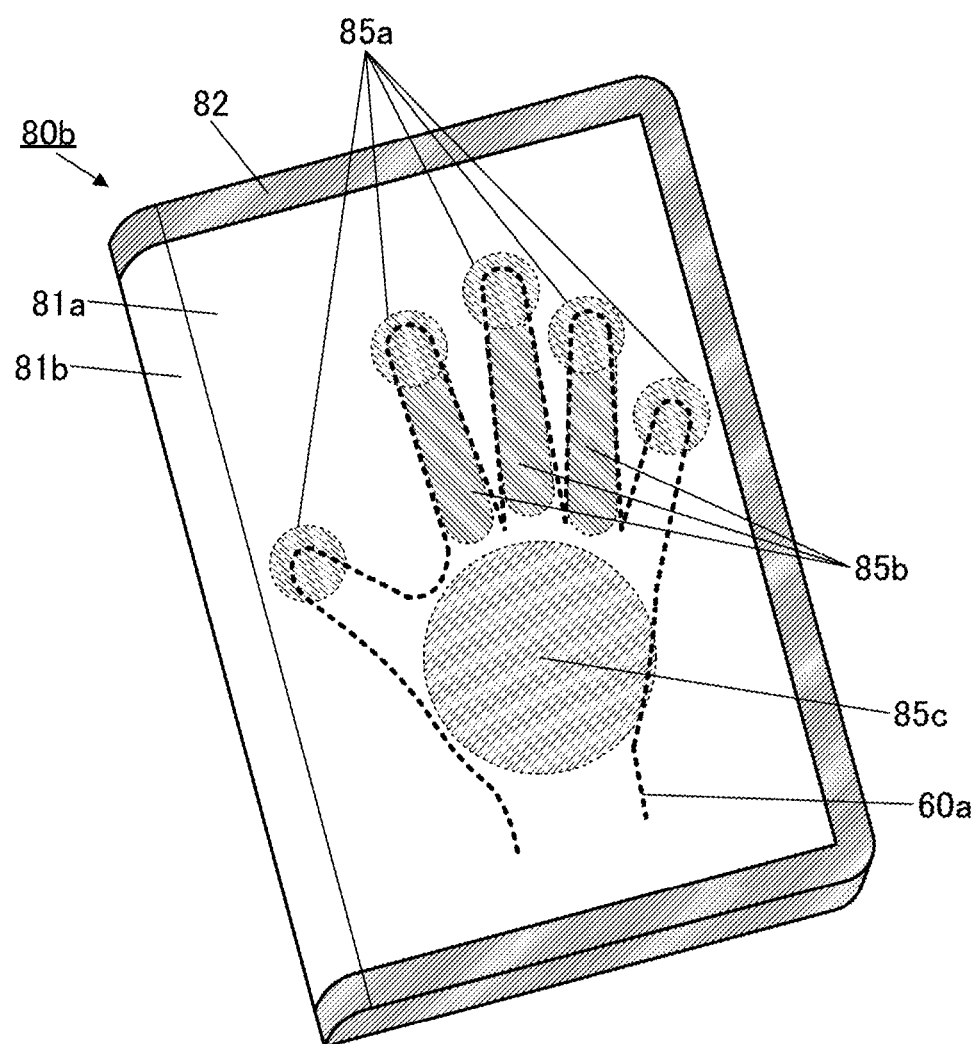

FIG. 13 is a diagram illustrating a structure example of an electronic device.

Figure 14:
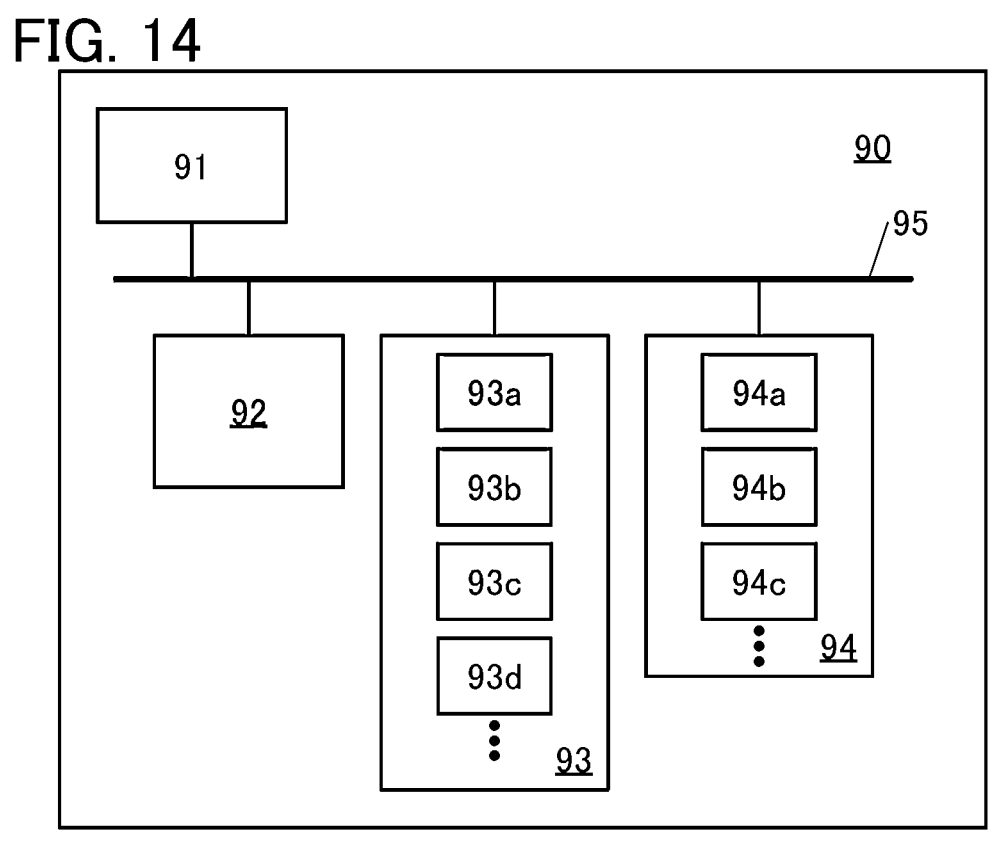

FIG. 14 is a diagram illustrating a structure example of a system.

Figure 15:
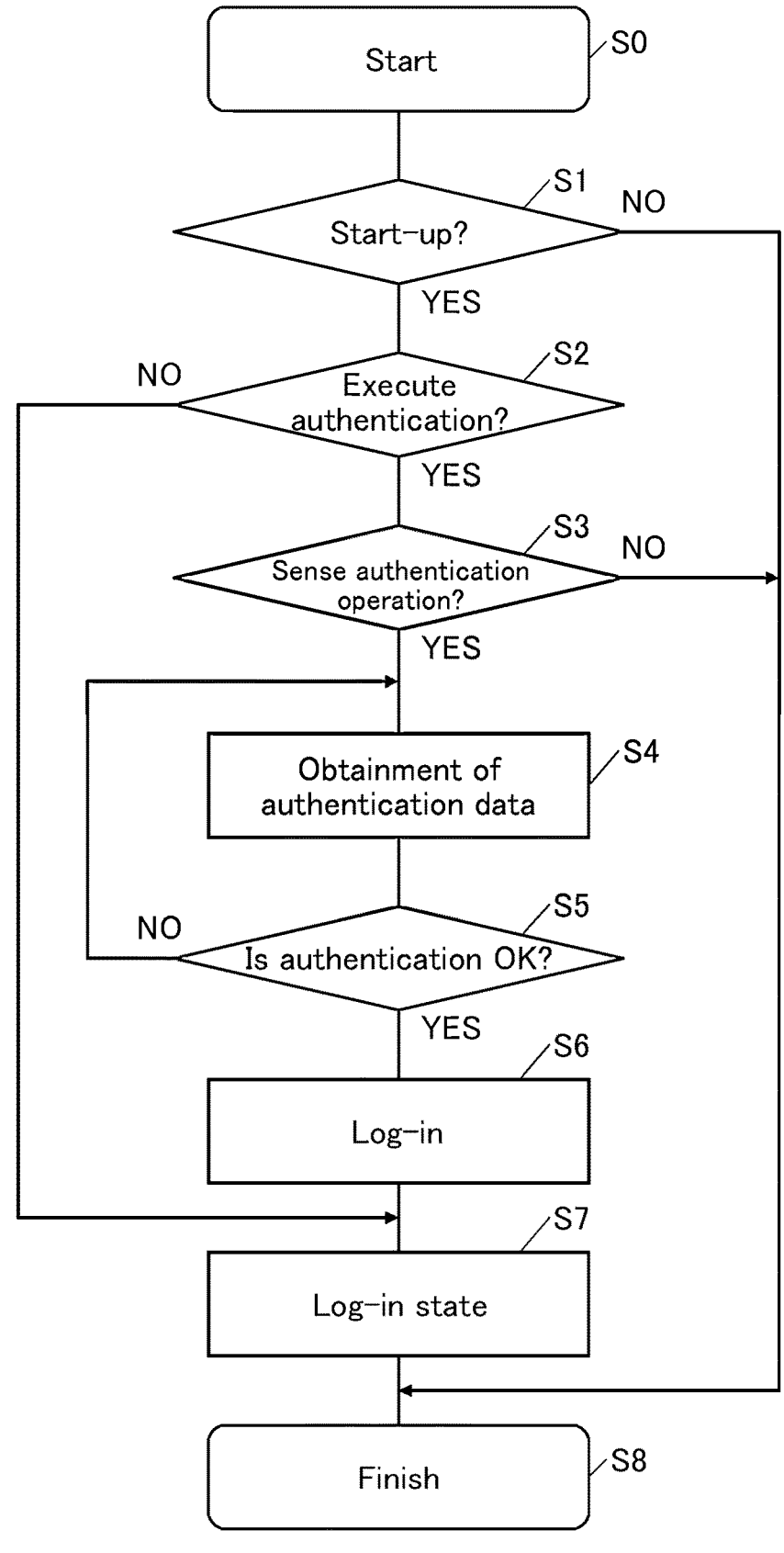

FIG. 15 is a flow chart showing a system operation method.

Figures 16A, 16B:
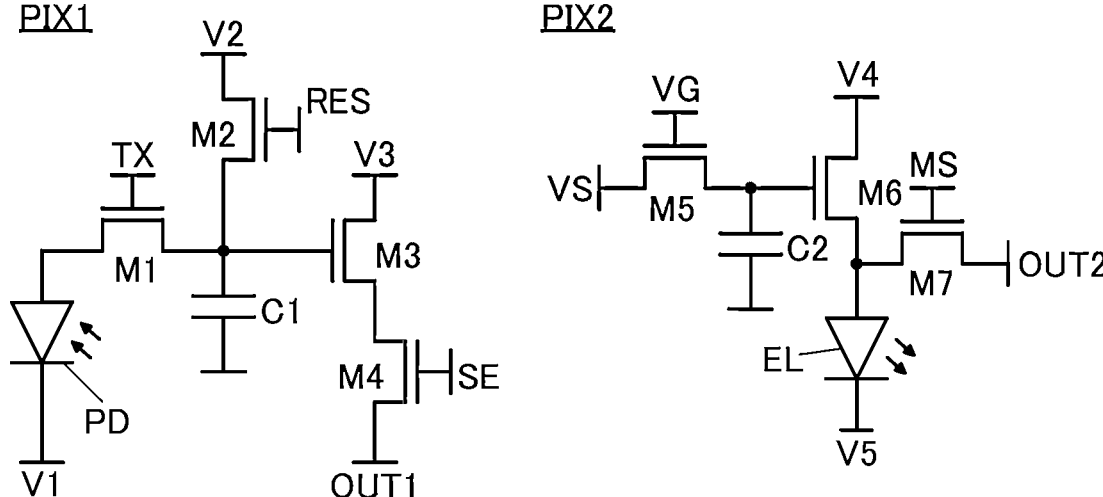

FIG. 16A and FIG. 16B are diagrams illustrating configuration examples of pixel circuits.

Figures 17A, 17B:
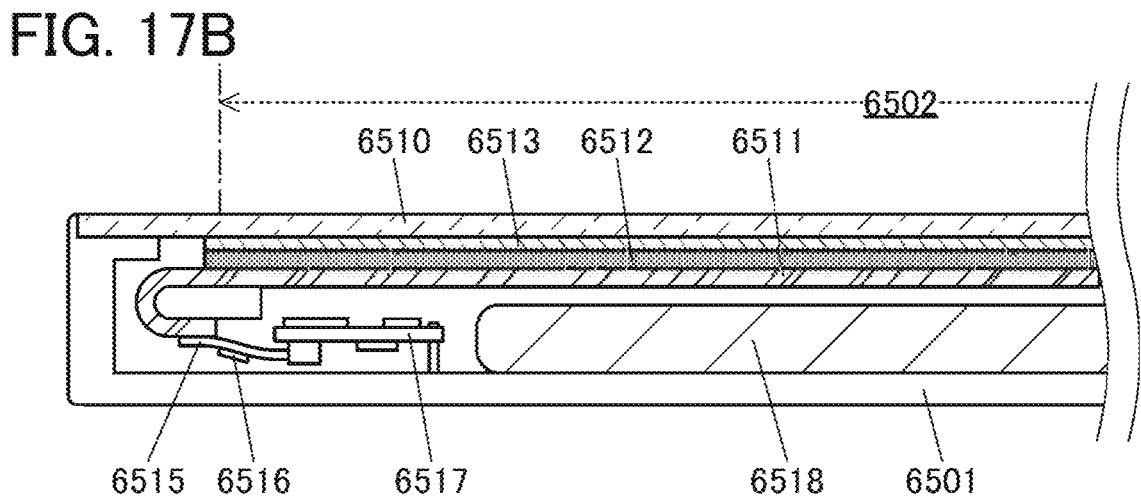

FIG. 17A and FIG. 17B are diagrams illustrating a structure example of an electronic device.

FIG. 18A to FIG. 18D are diagrams illustrating structure examples of electronic devices.

FIG. 19A to FIG. 19F are diagrams illustrating structure examples of electronic devices.

MODE FOR CARRYING OUT THE INVENTION

Embodiments will be described below with reference to the drawings. Note that the embodiments can be implemented in many different modes, and it will be readily understood by those skilled in the art that modes and details thereof can be changed in various ways without departing from the spirit and scope thereof. Thus, the present invention should not be construed as being limited to the following description of the embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, the ordinal numbers such as "first" and "second" are used in order to avoid confusion among components and do not limit the number.

Note that the expressions indicating directions such as "over" and "under" are basically used to correspond to the directions of drawings. However, in some cases, the direction indicating "over" or "under" in the specification does not correspond to the direction in the drawings for the purpose of description simplicity or the like. For example, when a stacking order (or formation order) of a stacked body or the like is described, even in the case where a surface on which the stacked body is provided (e.g., a formation surface, a support surface, an adhesion surface, or a planar surface) is positioned above the stacked body in the drawings, the direction and the opposite direction are expressed using "under" and "over", respectively, in some cases.

In this specification and the like, a display panel that is one embodiment of a display device has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel that is one embodiment of a display device has a function of displaying an image or the like on a display surface and a function of a touch sensor that senses a contact, press, approach, or the like of a sensing target such as a finger or a stylus with or to the display surface. Thus, the touch panel is one embodiment of an input/output device.

A touch panel can also be referred to as, for example, a display panel (or a display device) with a touch sensor, or a display panel (or a display device) having a touch sensor function. A touch panel can include a display panel and a touch sensor panel. Alternatively, a touch panel can have a function of a touch sensor in the display panel or on the surface of the display panel.

In this specification and the like, a substrate of a touch panel on which a connector or an IC is mounted is referred to as a touch panel module, a display module, or simply a touch panel or the like in some cases.

Embodiment 1

In this embodiment, a display device of one embodiment of the present invention is described.

The display device of one embodiment of the present invention includes a first light-emitting element exhibiting visible light, a second light-emitting element exhibiting invisible light, and a light-receiving element having sensitivity to invisible light and visible light. The first light-emitting element has a function of a display element for displaying an image using visible light. The light-receiving element is preferably a photoelectric conversion element. The first light-emitting element and the light-receiving element are preferably arranged on the same plane. The second light-emitting element is preferably provided on a plane different from the plane where the first light-emitting element and the light-receiving element are provided.

As each of the first light-emitting element and the second light-emitting element, an EL element such as an OLED (Organic Light Emitting Diode) or a QLED (Quantum-dot Light Emitting Diode) is preferably used. As a light-emitting substance contained in the EL element, a substance that emits fluorescence (a fluorescent material), a substance that emits phosphorescence (a phosphorescent material), an inorganic compound (e.g., a quantum dot material), a substance that exhibits thermally activated delayed fluorescence (a thermally activated delayed fluorescent (TADF) material), and the like can be given. Alternatively, an LED (Light Emitting Diode) such as a micro-LED can be used as the light-emitting element.

As the light-receiving element, a pn photodiode or a pin photodiode can be used, for example. The light-receiving element functions as a photoelectric conversion element that detects light incident on the light-receiving element and generates charge. The amount of generated charge in the photoelectric conversion element is determined depending on the amount of incident light. It is particularly preferable to use an organic photodiode including a layer containing an organic compound as the light-receiving element. An organic photodiode, which is easily made thin, lightweight, and large in area and has a high degree of freedom for shape and design, can be used in a variety of display devices.

The first light-emitting element and the second light-emitting element can each have a stacked-layer structure including a light-emitting layer between a pair of electrodes, for example. The light-receiving element can have a stacked-layer structure including an active layer between a pair of electrodes. A semiconductor material can be used for the active layer of the light-receiving element. For example, an inorganic semiconductor material such as silicon can be used.

In particular, it is preferable that an OLED be used as each of the first light-emitting element and the second light-emitting element and an organic photo diode (OPD) be used as the light-receiving element. Accordingly, some production facilities and manufacturing apparatuses for manufacturing the first light-emitting element, the second light-emitting element, and the light-receiving element, and some materials that can be used therefor can be used in common; thus, the manufacturing cost can be reduced. Furthermore, the manufacturing processes of the first light-emitting element, the second light-emitting element, and the light-receiving element can be simplified, so that the manufacturing yield can be improved.

An organic compound is preferably used for the active layer of the light-receiving element. In that case, one electrode of the first light-emitting element and one electrode of the light-receiving element (the electrodes are also referred to as pixel electrodes) are preferably provided on the same plane. It is further preferable that the other electrode of the first light-emitting element and the other electrode of the light-receiving element be an electrode (also referred to as a common electrode) formed using one continuous conductive layer. It is still further preferable that the first light-emitting element and the light-receiving element include a common layer. Thus, the manufacturing process of the first light-emitting element and the light-receiving element can be simplified, so that the manufacturing cost can be reduced and the manufacturing yield can be increased.

By forming the light-emitting layer of the first light-emitting element and the active layer of the light-receiving element separately, the first light-emitting element and the light-receiving element can be formed on the same plane. For example, the light-emitting layer and the active layer can be formed in an island shape or a belt shape by a formation method using a blocking mask such as a metal mask. In the formation method using a blocking mask, in consideration of expansion of a film to be formed, a margin (also referred to as a space or an allowable part) is sometimes provided between two island-shaped patterns formed by using different blocking masks.

Note that in this margin, a light-blocking layer that blocks light with a wavelength received by the light-receiving element can be provided. The light-blocking layer can have an opening or a slit defining a light-emitting region of the first light-emitting element and a light-receiving region of the light-receiving element.

The margin becomes a region that does not contribute to light emission and light reception, leading to a decrease in the proportion (effective light-emitting area ratio or effective light-receiving area ratio) of the area of the light-emitting region or the light-receiving region to the area of a display portion of the display device.

Thus, in one embodiment of the present invention, the second light-emitting element that emits invisible light is provided in a portion corresponding to the margin. The invisible light can be used as a light source at the time of capturing an image of an object by the light-receiving element. Moreover, the second light-emitting element is preferably placed above the light-blocking layer (on a display surface side). Furthermore, the second light-emitting element is preferably provided to overlap with the light-blocking layer and to be inside the outline of the light-blocking layer in a plan view. That is, it is preferable that the second light-emitting element be provided such that an end portion of the light-emitting region of the second light-emitting element is positioned inward from an end portion of the light-blocking layer. Thus, part of the invisible light emitted by the second light-emitting element is blocked by the light-blocking layer and thus can be prevented from directly entering the light-receiving element. Accordingly, the display device can capture a clear image with less noise.

Examples of the invisible light include infrared light and ultraviolet light. In particular, infrared light having one or more peaks in the range of a wavelength greater than or equal to 700 nm and less than or equal to 2500 nm can be favorably used. In particular, it is preferable to use light having intensity in a wavelength range of greater than or equal to 750 nm and less than or equal to 1000 nm, further preferably light having one or more peaks in this wavelength range, because the range of choices for materials used for the active layer of the light-receiving element is widened.

With the use of the above-described infrared light as the invisible light, the display device can also capture an image of a blood vessel, especially a vein of a finger, a hand, or the like using the light-receiving element. For example, light having a wavelength of 760 nm and its vicinity is not absorbed by reduced hemoglobin in a vein, so that the position of the vein can be sensed by making an image from reflected light from a palm, a finger, or the like that is received by the light-receiving element. A module or an electronic device including the display device of one embodiment of the present invention can perform vein authentication, which is a kind of biometric authentication, by utilizing a captured vein image.

When the visible light emitted by the first light-emitting element is used as a light source, an image of a shape of a palm print of a palm, a fingerprint of a fingertip, or the like can be captured. Since part of infrared light is reflected at a surface of a skin, the infrared light emitted by the second light-emitting element can also be used for capturing a shape of a fingerprint or the like. A module or an electronic device including the display device of one embodiment of the present invention can perform fingerprint authentication, which is a kind of biometric authentication, by utilizing a captured fingerprint image.

More specific structure examples are described below with reference to drawings.

Structure Example 1 of Display Device

Figure 1A:
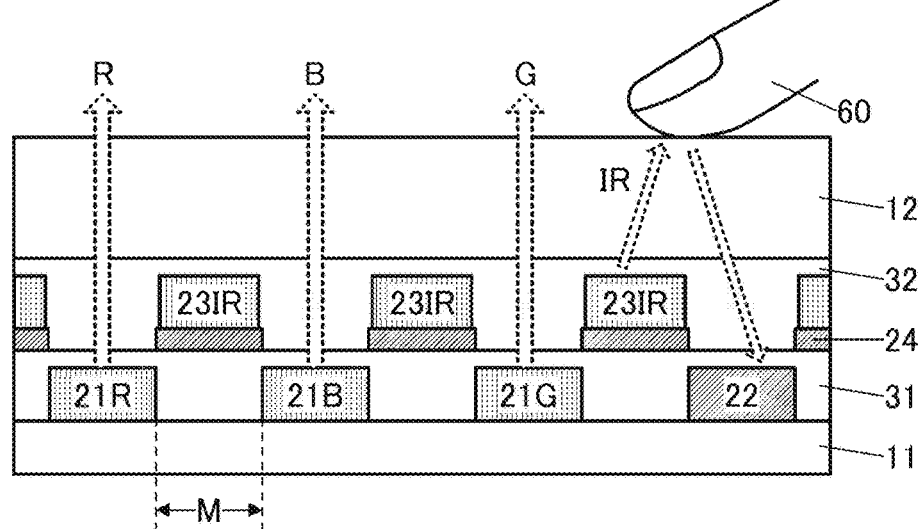
FIG. 1A to FIG. 1C are diagrams illustrating a structure example of a display device.

FIG. 1A illustrates a structure example of a display device 10. The display device 10 includes a light-emitting element 21R, a light-emitting element 21G, a light-emitting element 21B, a light-receiving element 22, a light-emitting element 23IR, a light-blocking layer 24, and the like between a substrate 11 and a substrate 12. The display device 10 also includes a resin layer 31 covering the light-emitting element 21R, the light-emitting element 21G, the light-emitting element 21B, and the light-receiving element 22, and a resin layer 32 covering the light-emitting element 23IR and the light-blocking layer 24.

The light-emitting element 21R, the light-emitting element 21G, the light-emitting element 21B, and the light-receiving element 22 are arranged over the substrate 11. The light-blocking layer 24 is provided above the light-emitting element 21R, the light-emitting element 21G, and the light-emitting element 21B. The light-emitting element 23IR is provided so as to overlap with the light-blocking layer 24. The light-blocking layer 24 includes portions positioned between the light-emitting elements and portions positioned between any of the light-emitting elements and the light-receiving element 22 in a plan view. Similarly, the light-emitting element 23IR includes portions positioned between the light-emitting elements and portions positioned between any of the light-emitting elements and the light-receiving element 22 in the plan view.

The light-emitting element 21R, the light-emitting element 21B, and the light-emitting element 21G emit red (R) light, blue (B) light, and green (G) light, respectively.

The display device 10 includes a plurality of pixels arranged in a matrix. One pixel includes one or more subpixels. One subpixel includes one light-emitting element. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel further includes the light-receiving element 22. The light-receiving element 22 may be provided in all the pixels or may be provided in some of the pixels. In addition, one pixel may include a plurality of light-receiving elements 22.

A margin is provided between two adjacent light-emitting elements and between any of the light-emitting elements and the light-receiving element 22 for forming them separately. In FIG. 1A, the light-emitting element 21R and the light-emitting element 21B are placed at an interval of a distance M. When an island-shaped organic film is formed as a film included in the light-emitting element or the light-receiving element by a vacuum evaporation method using a metal mask, for example, a deviation from a designed shape and position of the island-shaped organic film due to the alignment accuracy of the metal mask and a substrate, a warp of the metal mask, a vapor scattering, and the like can be caused. Thus, the distance M between the adjacent devices is preferably greater than or equal to 10 μm, further preferably greater than or equal to 20 μm, still further preferably greater than or equal to 30 μm and preferably less than or equal to 200 μm, further preferably less than or equal to 100 μm.

Note that in this specification and the like, a light-emitting element sometimes refers to a light-emitting region. As a specific example, in the case where a light-emitting element includes a pair of electrodes and a light-emitting layer therebetween, a region, which emits light when an electric field is applied, of the stack of the pair of electrodes and the light-emitting layer is sometimes referred to as a light-emitting element (light-emitting region). Thus, some or all of components of the light-emitting element may be positioned in a region different from the light-emitting region. Similarly, a light-receiving element sometimes refers to a light-receiving region.

The light-emitting element 23IR emits invisible light. Here, an example in which the light-emitting element 23IR emits infrared light IR.

The light-receiving element 22 is a photoelectric conversion element having sensitivity to at least infrared light emitted by the light-emitting element 23IR. The light-receiving element 22 has sensitivity in a wavelength range of greater than or equal to 700 nm and less than or equal to 900 nm, for example.

Moreover, the light-receiving element 22 preferably has sensitivity not only to infrared light but also to light emitted by the light-emitting element 21R, light emitted by the light-emitting element 21B, and light emitted by the light-emitting element 21G. In the case where the light-receiving element 22 has sensitivity to visible light and infrared light, the light-receiving element 22 preferably has sensitivity in a wavelength range of greater than or equal to 500 nm and less than or equal to 1000 nm, a wavelength range of greater than or equal to 500 nm and less than or equal to 950 nm, or a wavelength range of greater than or equal to 500 nm and less than or equal to 900 nm, for example.

FIG. 1A illustrates a state where a finger 60 touches a surface of the substrate 12. At this time, part of the infrared light IR emitted by the light-emitting element 23IR is reflected by a surface or inside of the finger 60, and part of the reflected light enters the light-receiving element 22. Accordingly, information about the position where the finger 60 touches can be obtained. An image of one or both of a shape of a vein and a shape of a fingerprint of the finger 60 can be captured.

Figure 1B:
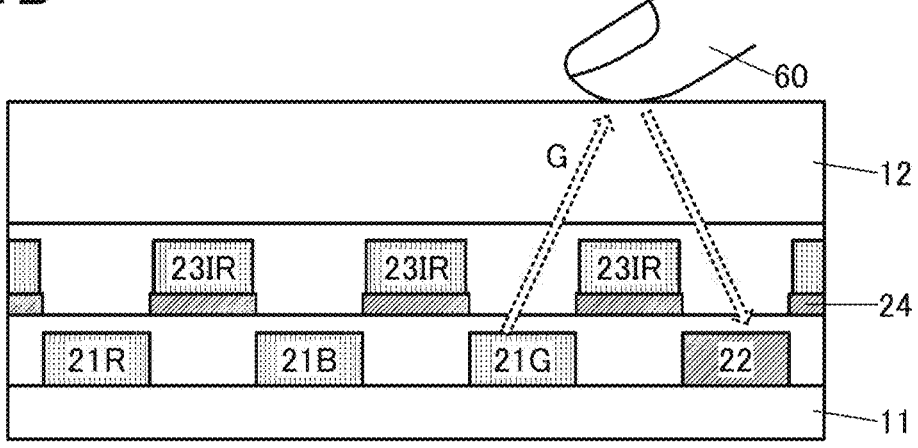

Owning to the light emitted by any of the light-emitting element 21R, the light-emitting element 21B, and the light-emitting element 21G, the positional information of the finger 60 can be obtained or an image of the fingerprint can be captured. As an example, FIG. 1B illustrates a state where the light-receiving element 22 receives the light reflected by the finger 60 among light G emitted by the light-emitting element 21G.

Figure 1C:
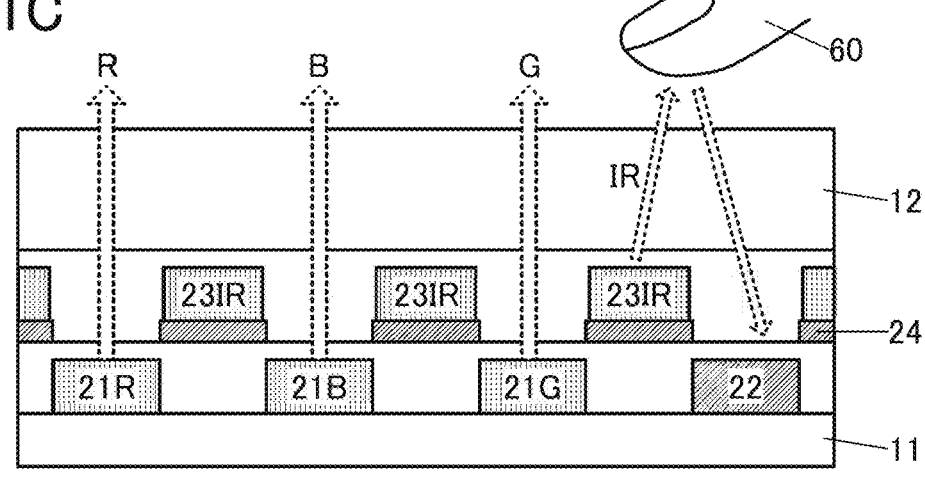

Even when the finger 60 is positioned apart from the substrate 12 as illustrated in FIG. 1C, the positional information of the finger 60 can be obtained. That is, the display device 10 can function as a contactless touch panel. Note that depending on the distance between the finger 60 and the substrate 12, the shape of a fingerprint or a vein can be obtained in some cases. In such a case, a module or an electronic device including the display device 10 can functions as a contactless biometric authentication device.

The smaller an arrangement interval between the light-receiving elements 22 is, the higher the resolution of the image captured can be. For example, when the arrangement interval between the light-receiving elements 22 is smaller than the distance between two projections of the fingerprint, preferably the distance between a depression and a projection adjacent to each other, a clear fingerprint image can be obtained. The distance between a depression and a projection of a human's fingerprint is approximately 200 μm; thus, the arrangement interval between the light-receiving elements 22 is, for example, less than or equal to 400 μm, preferably less than or equal to 200 μm, further preferably less than or equal to 150 μm, still further preferably less than or equal to 100 μm, even still further preferably less than or equal to 50 μm and greater than or equal to 1 μm, preferably greater than or equal to 10 μm, further preferably greater than or equal to 20 μm.

Note that the display device 10 can capture an image of not only a fingerprint but also a variety of objects that touch or approach the surface of the substrate 12. Thus, the display device 10 can also be used as an image sensor panel. A color image can be obtained in the following manner, for example: the light-emitting element 21R, the light-emitting element 21B, and the light-emitting element 21G are made to emit light sequentially, image capturing is performed by the light-receiving element 22 each time, and composition of the obtained three images is performed. In other words, an electronic device including the display device 10 can also be used as an image scanner capable of color imaging. When an image is captured by the light-receiving element 22 in a state where the light-emitting element 23IR emits light, the electronic device including the display device 10 can be used as an image scanner using infrared light.

The display device 10 can also function as a touch panel, a pen tablet, or the like with the use of the light-receiving element 22. Unlike in the case of using a capacitive touch sensor, an electromagnetic induction touch sensor, or the like, the display device 10 can sense even the position of a highly insulating sensing target with the use of the light-receiving element 22; hence, the material of the sensing target such as a stylus is not limited, and a variety of writing materials (e.g., a brush, a glass pen, and a quill pen) can be used.

Structure Example 2 of Display Device

More specific structure examples of the display device are described below.

Figure 2A:
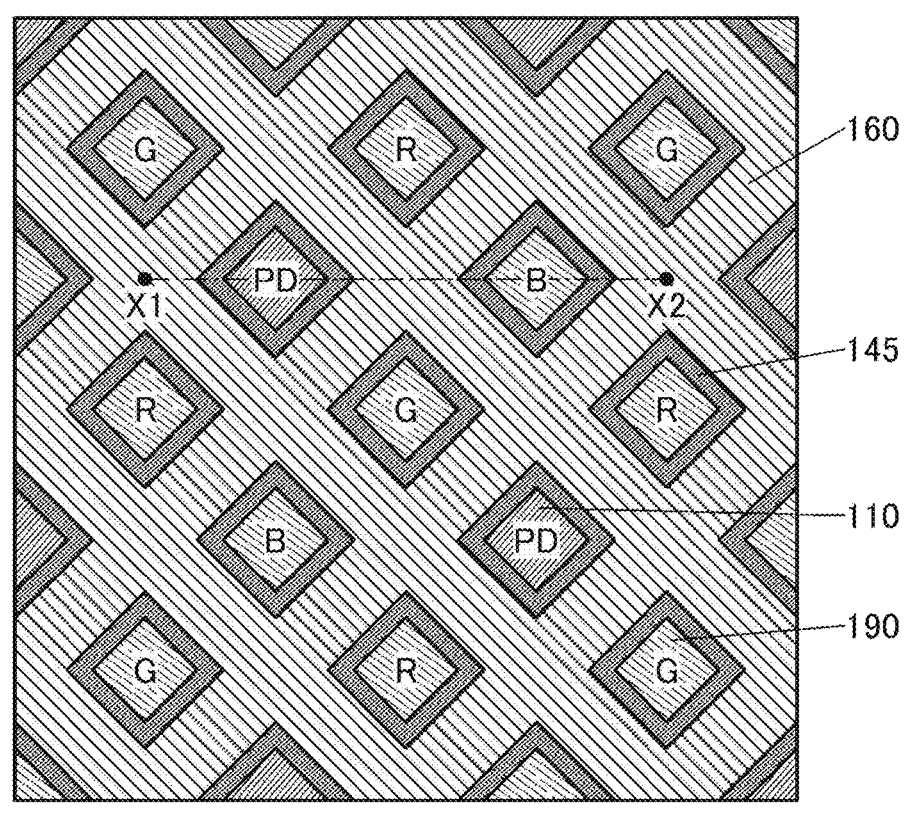
FIG. 2A and FIG. 2B are diagrams illustrating a structure example of a display device.
Figure 2B:
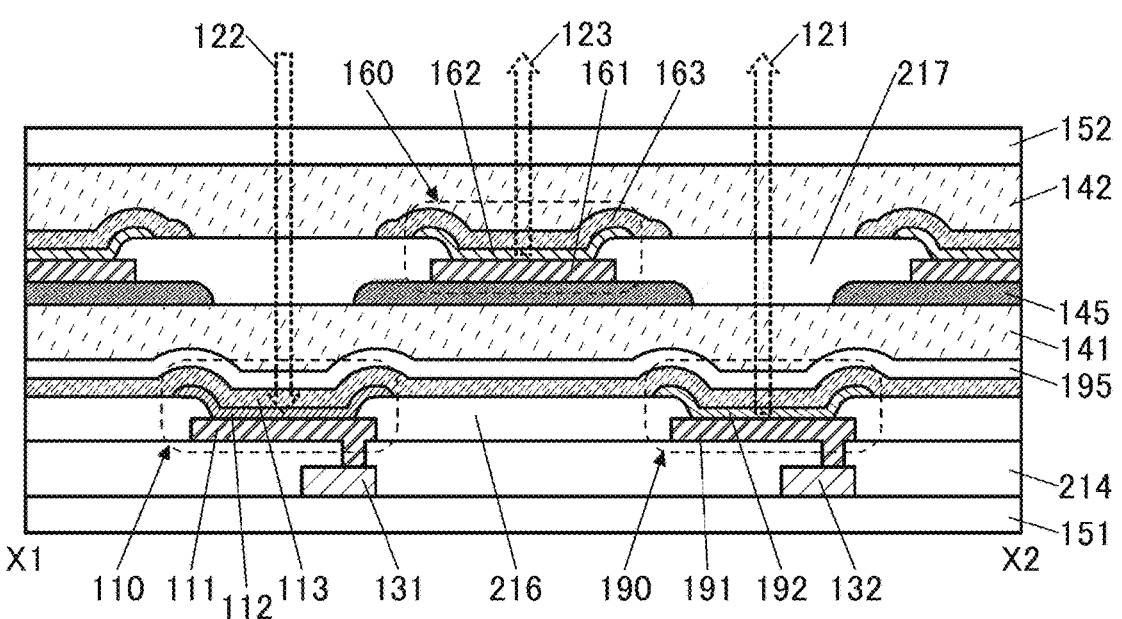

FIG. 2A illustrates a schematic top view of a display device 100 described below when seen from the display surface side. FIG. 2B illustrates a schematic cross-sectional view corresponding to a cross section taken along a dashed-dotted line X1-X2 in FIG. 2A.

The display device 100 includes a light-receiving element 110, a light-emitting element 190, a light-emitting element 160, a transistor 131, a transistor 132, a light-blocking layer 145, a resin layer 141, a resin layer 142, and the like between a pair of substrates (a substrate 151 and a substrate 152).

The light-emitting element 190 emits light of any one of red (R), green (G), and blue (B).

FIG. 2A illustrates top surface shapes of the light-receiving elements 110, the light-emitting elements 190, the light-emitting element 160, and the light-blocking layer 145. Note that the light-emitting elements 190 are denoted by R, G, and B to be differentiated by emission color. In addition, the light-receiving elements 110 are denoted by PD.

In FIG. 2A, rows in which the light-emitting elements 190 of R and the light-emitting elements 190 of G are alternately arranged and rows in which the light-receiving elements 110 and the light-emitting elements 190 of B are alternately arranged are alternately arranged in the column direction. Note that a relative positional relation between the light-emitting elements 190 and the light-receiving elements 110 is not limited thereto, and the given two elements may be interchanged with each other.

The light-blocking layer 145 is provided between two adjacent light-emitting elements 190 and between the light-receiving element 110 and the light-emitting element 190 adjacent to each other. The light-emitting element 160 is provided to overlap with the light-blocking layer 145. In FIG. 2A, the light-emitting element 160 having a lattice shape is provided over the light-blocking layer 145 having a lattice shape. As illustrated in FIG. 2A, the light-emitting element 160 is preferably provided inside the outline of the light-blocking layer 145. In other words, in a plan view, an end portion of the light-blocking layer 145 is preferably positioned between any of the light-receiving elements 110 and the light-emitting element 160. Moreover, in the plan view, another end portion of the light-blocking layer 145 is preferably positioned between any of the light-emitting elements 190 and the light-emitting element 160.

FIG. 2A illustrates an example of the case where the light-emitting element 160 is provided continuously across the entire display region. With such a structure, the entire display region can be in a light emitting state or a non-light emitting state, whereby extremely simplified control for driving the light-emitting element 160 is possible.

Figure 3A:
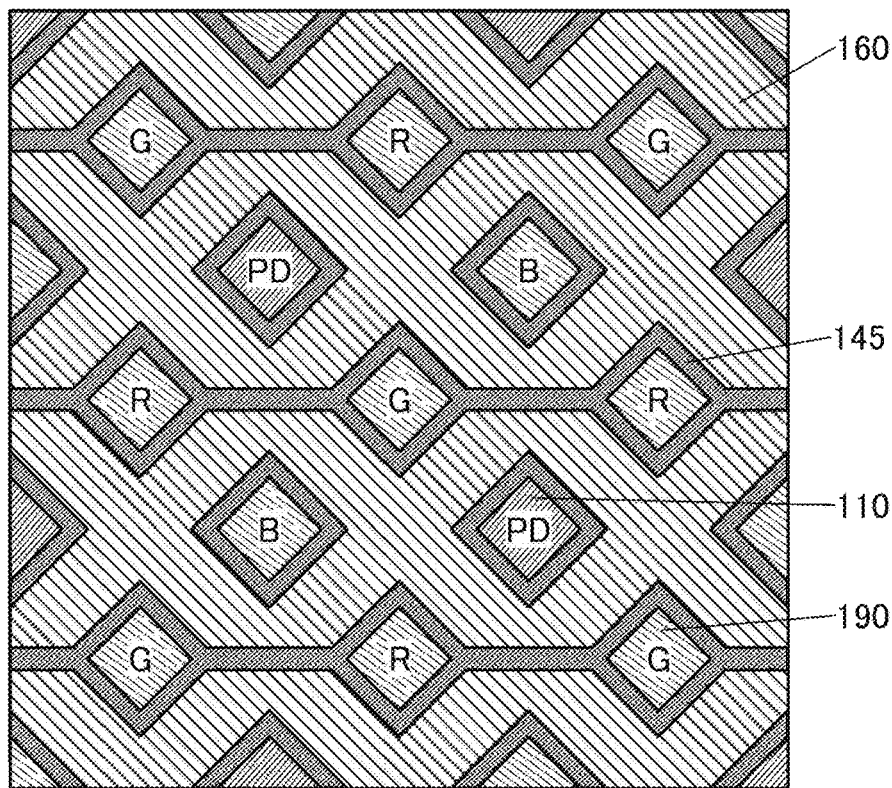
FIG. 3A and FIG. 3B are diagrams illustrating structure examples of a display device.

FIG. 3A illustrates an example of the case where belt-shaped light-emitting elements 160 that extend in the row direction are arranged in the column direction. With such a structure, the belt-shaped light-emitting elements 160 can be made to sequentially emit light.

Figure 3B:
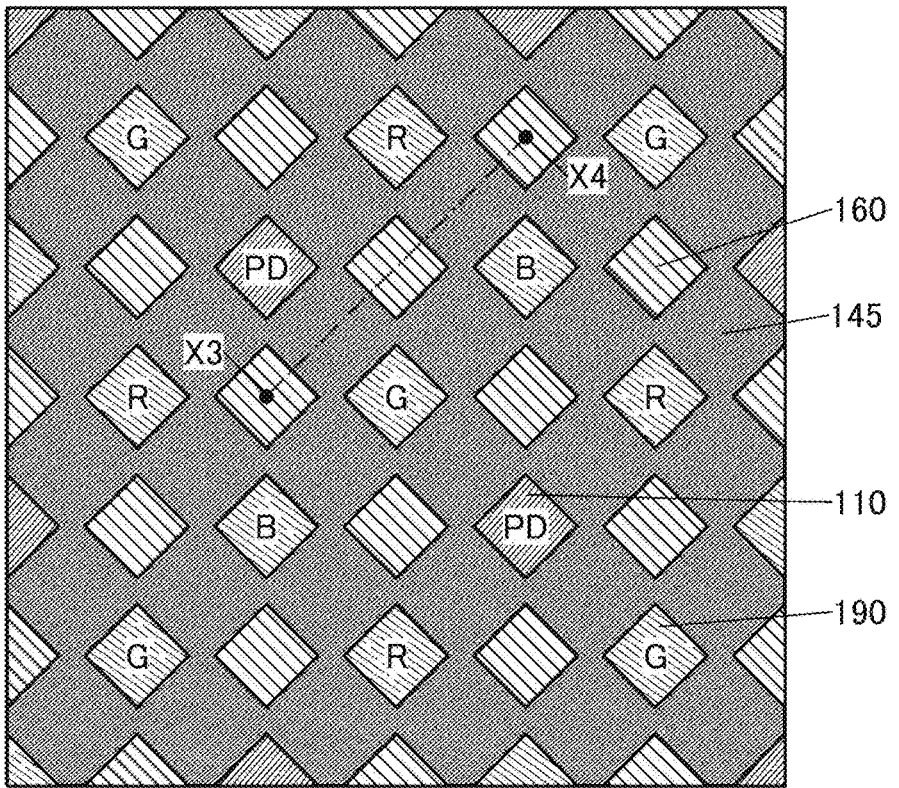

FIG. 3B illustrates an example of the case where island-shaped light-emitting elements 160 are arranged in a matrix. In this case, the light-emitting elements 160 can employ a driving method by a passive matrix method. Alternatively, a driving method by an active matrix method may be employed.

Although the top surface shapes and the sizes of the light-emitting elements 160 are the same as those of the light-emitting elements 190 and the light-receiving elements 110 in FIG. 3B for easy understanding, the present invention is not limited thereto and the light-emitting elements 160, the light-emitting elements 190, and the light-receiving elements 110 may have different top surface shapes and sizes.

As illustrated in FIG. 2B, the transistor 131 and the transistor 132 are provided over the substrate 151, and an insulating layer 214 is provided thereover.

Each of the light-receiving elements 110 includes a pixel electrode 111, a photoelectric conversion layer 112, and a common electrode 113. Each of the light-emitting elements 190 includes a pixel electrode 191, an EL layer 192, and the common electrode 113. The photoelectric conversion layer 112 includes at least an active layer. The EL layer 192 includes at least a light-emitting layer.

The light-emitting element 190 has a function of emitting visible light. Specifically, the light-emitting element 190 is an electroluminescent element that emits light 121 to the substrate 152 side when voltage is applied between the pixel electrode 191 and the common electrode 113.

The light-receiving element 110 has a function of detecting light. Specifically, the light-receiving element 110 is a photoelectric conversion element that receives light 122 entering from the outside through the substrate 152 and converts the light 122 into an electrical signal.

The pixel electrode 111 and the pixel electrode 191 are provided on the same plane. The pixel electrode 111 and the pixel electrode 191 are preferably formed by processing the same conductive film. The pixel electrode 111 and the pixel electrode 191 preferably have a function of reflecting visible light and infrared light. End portions of the pixel electrode 111 and the pixel electrode 191 are covered with a partition 216. The common electrode 113 has a function of transmitting visible light and infrared light.

The common electrode 113 is shared by the light-receiving element 110 and the light-emitting element 190. Specifically, the common electrode 113 includes a portion overlapping with the pixel electrode 111 with the photoelectric conversion layer 112 therebetween and a region overlapping with the pixel electrode 191 with the EL layer 192 therebetween.

Note that in addition to the common electrode 113, a layer may be shared with the light-receiving element 110 and the light-emitting element 190. For example, an active layer and a light-emitting layer are formed separately, and the other layers may be used in common.

The layer shared by the light-receiving element 110 and the light-emitting element 190 might have different functions between the light-receiving element and the light-emitting element. In this specification, the name of a component is based on its function in the light-emitting element.

For example, a hole-injection layer functions as a hole-injection layer in the light-emitting element and functions as a hole-transport layer in the light-receiving element. Similarly, an electron-injection layer functions as an electron-injection layer in the light-emitting element and functions as an electron-transport layer in the light-receiving element. The hole-transport layer functions as a hole-transport layer in both the light-emitting element and the light-receiving element. Similarly, the electron-transport layer functions as an electron-transport layer in both the light-emitting element and the light-receiving element.

A protective layer 195 is provided over the common electrode 113 to cover the light-receiving element 110 and the light-emitting element 190. The protective layer 195 has a function of preventing diffusion of impurities such as water into the light-receiving element 110 and the light-emitting element 190 from the resin layer 141 side. Provision of the protective layer 195 can reduce damage imposed on the light-receiving element 110 and the light-emitting element 190 during the process after the formation process of the protective layer 195.

The protective layer 195 can have a single-layer structure or a stacked-layer structure including at least an inorganic insulating film. As the inorganic insulating film, for example, an oxide film or a nitride film such as a silicon oxide film, a silicon oxynitride film, a silicon nitride oxide film, a silicon nitride film, an aluminum oxide film, an aluminum oxynitride film, or a hafnium oxide film can be given.

The resin layer 141 is provided to cover the protective layer 195. The resin layer 141 functions as a planarization film.

The light-blocking layer 145 is provided over the resin layer 141. The light-blocking layer 145 preferably absorbs visible light and infrared light. As the light-blocking layer 145, a black matrix can be formed using a metal material or a resin material containing pigment (e.g., carbon black) or dye, for example. Alternatively, the light-blocking layer 145 may have a stacked-layer structure including two or more of a red color filter, a green color filter, and a blue color filter.

The light-emitting element 160 is provided over the light-blocking layer 145. The light-emitting element 160 includes an electrode 161, an EL layer 162, and an electrode 163.

The light-emitting element 160 has a function of emitting infrared light. Specifically, the light-emitting element 160 is an electroluminescent element that emits light 123 to the substrate 152 side when voltage is applied between the electrode 161 and the electrode 163.

An insulating layer 217 is provided to cover end portions of the electrode 161 and the light-blocking layer 145. The insulating layer 217 preferably functions as a planarization film.

FIG. 2B illustrates an example in which the electrode 161, the EL layer 162, and the electrode 163 are processed so as to be positioned inside the outline of the light-blocking layer 145 in a plan view. In this case, end portions of the EL layer 162 are preferably covered with the electrode 163 as illustrated in FIG. 2B. Thus, the electrode 163 functions as a protective layer and impurities such as water can be prevented from diffusing from the resin layer 142 side into the EL layer 162, whereby the reliability of the light-emitting element 160 can be increased.

In addition, the electrode 161 preferably has a function of reflecting infrared light. The electrode 163 preferably has a function of transmitting infrared light.

As illustrated in FIG. 2B, it is preferable that the EL layer 162 and the electrode 163 be not provided over the light-emitting element 190 or over the light-receiving element 110. Accordingly, part of the light 121 and part of the light 122 are not reflected by the EL layer 162 and the electrode 163, and a display device with high emission efficiency and high light sensitivity can be obtained.

The resin layer 142 is provided to cover the light-emitting element 160. The substrate 152 is provided over the resin layer 142. The resin layer 142 preferably functions as an adhesive layer for bonding the substrate 151 and the substrate 152 to each other.

The transistor 131 and the transistor 132 are on and in contact with the same layer (the substrate 151 in FIG. 2B). The pixel electrode 111 is electrically connected to a source or a drain of the transistor 131 through an opening provided in the insulating layer 214. The pixel electrode 191 is electrically connected to a source or a drain of the transistor 132 through an opening provided in the insulating layer 214. The transistor 132 has a function of controlling the driving of the light-emitting element 190.

At least part of a circuit electrically connected to the light-receiving element 110 and a circuit electrically connected to the light-emitting element 190 are preferably formed using the same material in the same step. In this case, the thickness of the display device can be smaller and the fabrication process can be simpler than in the case where the two circuits are separately formed.

Here, it is preferable that the common electrode 113 shared by the light-emitting element 190 and the light-receiving element 110 be electrically connected to a wiring to which a first potential is supplied. As the first potential, a fixed potential such as a common potential, a ground potential, or a reference potential can be used. Note that the first potential supplied to the common electrode 113 is not limited to a fixed potential, and two or more different potentials can be selected to be supplied.

When the light-receiving element 110 receives light and converts the light into an electrical signal, the pixel electrode 111 is preferably supplied with a second potential lower than the first potential supplied to the common electrode 113. As the second potential, a potential with which light-reception sensitivity or the like is optimized can be selected to be supplied in accordance with the structure, the optical characteristics, the electrical characteristics, or the like of the light-receiving element 110. That is, in the case where the light-receiving element 110 is regarded as a photodiode, the first potential supplied to the common electrode 113 functioning as a cathode and the second potential supplied to the pixel electrode 111 functioning as an anode can be selected so that reverse bias voltage is applied. When the light-receiving element 110 is not driven, a potential at the same or substantially the same level as the first potential or a potential higher than the first potential may be supplied to the pixel electrode 111.

In contrast, when the light-emitting element 190 is made to emit light, the pixel electrode 191 is preferably supplied with a third potential higher than the first potential supplied to the common electrode 113. As the third potential, a potential with which required emission luminance is achieved can be selected to be supplied in accordance with the structure, the threshold voltage, the current-luminance characteristics, or the like of the light-emitting element 190. That is, in the case where the light-emitting element 190 is regarded as a light-emitting diode, the first potential supplied to the common electrode 113 functioning as a cathode and the third potential supplied to the pixel electrode 191 functioning as an anode can be selected so that forward bias voltage is applied. When the light-emitting element 190 is not made to emit light, a potential at the same or substantially the same level as the first potential or a potential lower than the first potential may be supplied to the pixel electrode 191.

Here, the case where the common electrode 113 functions as a cathode and the pixel electrodes each function as an anode in the light-receiving element 110 and the light-emitting element 190 is described as an example, but one embodiment of the present invention is not limited thereto; the common electrode 113 may function as an anode and the pixel electrodes may each function as a cathode. In such a case, a potential higher than the first potential is supplied as the second potential to drive the light-receiving element 110, and a potential lower than the first potential is supplied as the third potential to drive the light-emitting element 190.

Structure Example 2-2

Figure 4A:
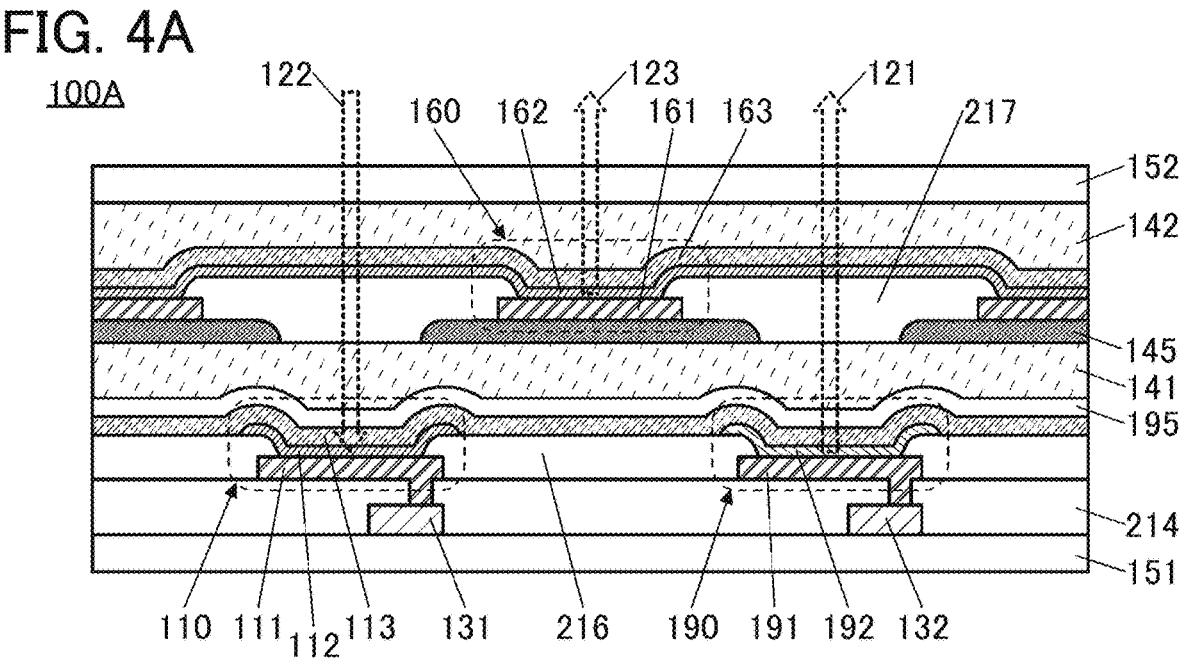
FIG. 4A and FIG. 4B are diagrams illustrating structure examples of display devices.

FIG. 4A illustrates a schematic cross-sectional view of a display device with a structure partly different from the above. A display device 100A illustrated in FIG. 4A is different from the display device 100 mainly in the structure of the light-emitting element 160.

The EL layer 162 and the electrode 163 included in the light-emitting element 160 each include a portion overlapping with the light-receiving element 110 and a portion overlapping with the light-emitting element 190. With such a structure, a continuous film can be used for each of the EL layer 162 and the electrode 163; thus, the process can be simplified. The EL layer 162 and the electrode 163 can be successively formed, whereby impurities (e.g., water) contained in the atmosphere can be inhibited from entering therebetween, increasing the reliability.

The EL layer 162 and the electrode 163 transmit visible light emitted by the light-emitting element 190 and thus each preferably include a film with little absorption with respect to visible light. For example, the material and the thickness of each of the EL layer 162 and the electrode 163 are preferably selected so that a stack of the EL layer 162 and the electrode 163 has a transmittance of higher than or equal to 50% and lower than or equal to 100%, preferably higher than or equal to 60% and lower than or equal to 100%, further preferably higher than or equal to 70% and lower than or equal to 100% with respect to the light emitted by the light-emitting element 190.

The EL layer 162 and the electrode 163 transmit the light 122, i.e., the light 123 that includes infrared light emitted by the light-emitting element 160 and is reflected by an object, and thus each preferably include a film with little absorption with respect to infrared light. For example, the material and the thickness of each of the EL layer 162 and the electrode 163 are preferably selected so that the stack of the EL layer 162 and the electrode 163 has a transmittance of higher than or equal to 50% and lower than or equal to 100%, preferably higher than or equal to 60% and lower than or equal to 100%, further preferably higher than or equal to 70% and lower than or equal to 100% with respect to the infrared light emitted by the light-emitting element 160.

When the EL layer 162 and the electrode 163 each have a high transmittance with respect to visible light and infrared light, the light extraction efficiency is improved, whereby the display luminance or the emission illuminance of the display device can be increased. Since the luminance of the light 122 reaching the light-receiving element 110 can be increased, the detection sensitivity can be increased.

Structure Example 2-3

Figure 4B:
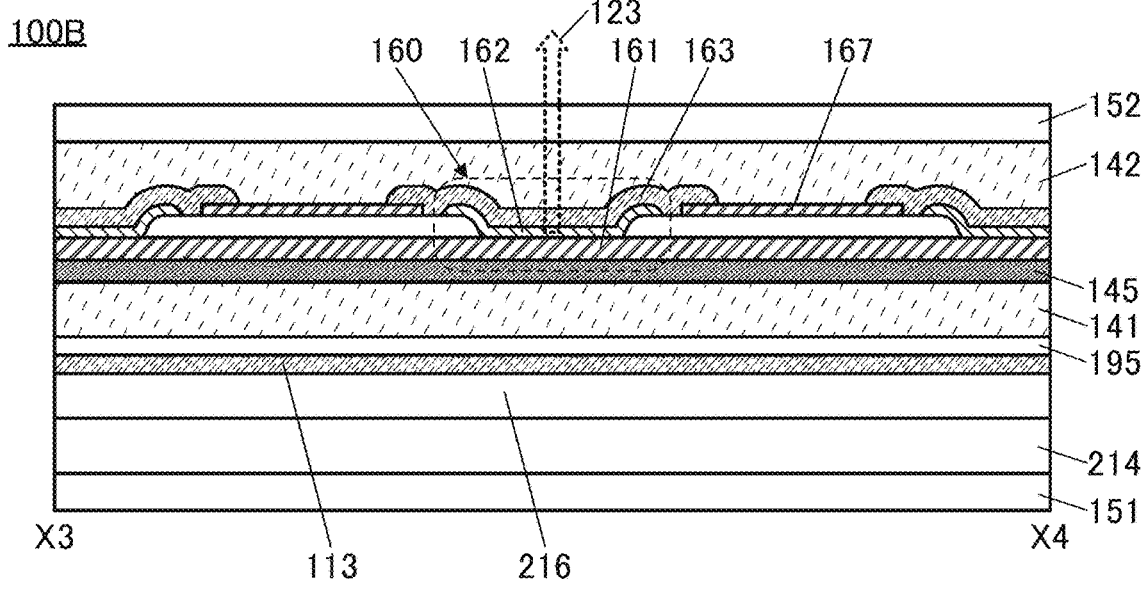

FIG. 4B illustrates a schematic cross-sectional view of a display device 100B with a structure different from the above. The schematic cross-sectional view corresponds to a schematic cross-sectional view taken along a dashed-dotted line X3-X4 of the schematic top view in FIG. 3B.

In FIG. 4B, a conductive layer 167 is provided between two light-emitting elements 160. The conductive layer 167 functions as a wiring for electrically connecting the island-shaped electrodes 163 included in the two light-emitting elements 160.

A conductive material used for the electrodes 163 preferably has a higher light-transmitting property, in which case the extraction efficiency of the light 123 emitted by the light-emitting elements 160 can be improved. However, it is not easy to achieve both a high light-transmitting property and high conductivity. When the electrodes 163 have high electric resistance, a voltage drop occurs and thus voltages applied to the light-emitting elements 160 vary, resulting in degradation of emission luminance uniformity on the entire screen in some cases. Thus, the electrodes 163 of the light-emitting elements 160 formed to have island-shaped top surfaces and electrically connected with each other by the conductive layer 167 having high conductivity, whereby a voltage drop can be inhibited.

Although the electrodes 163 have island-shaped top surfaces here, a continuous film may be used as in the display device 100A. In this case, the EL layer 162 is preferably formed in an island shape.

Structure Example 3 of Display Device

A circuit configuration example which can be used for the display device is described below.

Figures 5A, 5B, 5C:
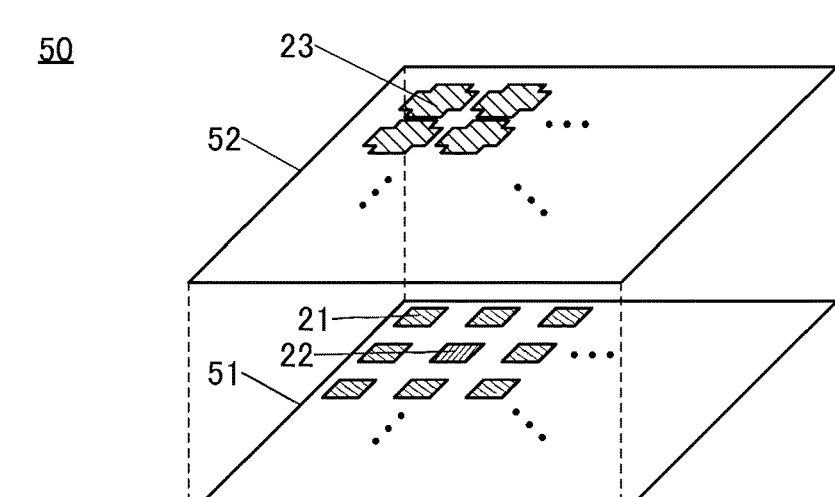
FIG. 5A to FIG. 5C are diagrams illustrating a structure example of a display device.

FIG. 5A illustrates a schematic perspective view of a display device 50. The display device of one embodiment of the present invention can be regarded as having a structure in which a layer 51 including light-emitting elements 21 and the light-receiving elements 22 and a layer 52 including light-emitting elements 23 are stacked as illustrated in FIG. 5A. In the layer 51, the light-emitting elements 21 and the light-receiving elements 22 are arranged in a matrix. Here, the case where the arrangement in FIG. 2A or the like is rotated by 45° is illustrated.

The light-emitting elements 23 are provided in the layer 52. Here, an example in which the light-emitting elements 23 are arranged in a matrix is described. Note that the arrangement of the light-emitting elements 23 is not limited to this, and one light-emitting element 23 may be provided over the entire layer 52 or the light-emitting elements 23 each having a belt-shaped top surface may be provided in one direction.

Next, a circuit for controlling light emission and light reception of the display device 50 is described.

FIG. 5B is a block diagram illustrating a configuration example of the layer 51 and its peripheral circuit. The layer 51 includes pixels 71 and pixels 72. The pixels 71 function as subpixels and are circuits for controlling the emission luminance of any of the red, green, and blue light-emitting elements 21. The pixels 72 are circuits for controlling light-receiving operation and reading operation of the light-receiving elements 22.

The pixels 71 each include at least a transistor (a selection transistor) for controlling selection or non-selection of the pixel and a transistor (a driving transistor) for controlling current flowing through the light-emitting element 21. The pixels 71 can be driven by an active matrix method.

The pixels 72 each include at least a transistor (a selection transistor) for controlling selection or non-selection of the pixel. The pixels 72 can be driven by an active matrix method.

A circuit portion 75a, a circuit portion 76a, a circuit portion 77, and a circuit portion 78 are electrically connected to the layer 51. The circuit portion 75a is electrically connected to a plurality of pixels 71 arranged in the row direction through a wiring GLa. The circuit portion 76a is electrically connected to a plurality of pixels 71 arranged in the column direction through a wiring SLa. The circuit portion 77 is electrically connected to a plurality of pixels 72 arranged in the row direction through a wiring CL. The circuit portion 78 is electrically connected to a plurality of pixels 72 arranged in the column direction through a wiring WL. Note that although the wiring GLa, the wiring SLa, the wiring CL, and the wiring WL are each illustrated as one wiring here, they may each be a plurality of wirings supplied with different signals or potentials.

The circuit portion 75a functions as a scan line driver circuit (also referred to as a gate line driver circuit, a gate driver, a scan driver, or the like). The circuit portion 75a has a function of generating a selection signal for selecting the pixels 71 and outputting the selection signal to the wiring GLa. The circuit portion 76a functions as a signal line driver circuit (also referred to as a source line driver circuit, a source driver, or the like). The circuit portion 76a has a function of outputting a data signal (data potential) to the wiring SLa.

The circuit portion 77 functions as a scan line driver circuit. The circuit portion 77 has a function of generating a timing signal or the like to be supplied to the pixels 72 and outputting the timing signal or the like to the wiring CL. The circuit portion 78 functions as a reading circuit. The circuit portion 78 has a function of converting the signal output from the pixels 72 through the wiring WL into data (digital data or analog data) that can be processed by an external device and outputting the data.

FIG. 5C is a block diagram illustrating a configuration example of the layer 52 and its peripheral circuit. The layer 52 includes pixels 73. The pixels 73 are circuits for controlling the emission luminance of the light-emitting elements 23. The pixels 73 can have structures similar to those of the pixels 71. The pixels 73 can be driven by an active matrix method.

A circuit portion 75b and a circuit portion 76b are electrically connected to the layer 52. The circuit portion 75b is electrically connected to a plurality of pixels 73 arranged in the row direction through a wiring GLb. The circuit portion 76b is electrically connected to a plurality of pixels 73 arranged in the column direction through a wiring SLb.

The circuit portion 75b functions as a scan line driver circuit, and the circuit portion 76b functions as a signal line driver circuit. The description of the circuit portion 75a and the circuit portion 76a can be referred to for the circuit portion 75b and the circuit portion 76b, respectively.

The light-emitting elements 23 included in the layer 52 may have a structure in which light emission is controlled by a passive matrix method or a segment method. In that case, a pixel configuration and a peripheral circuit configuration can be simplified, which can reduce the manufacturing cost.

Figure 6A:
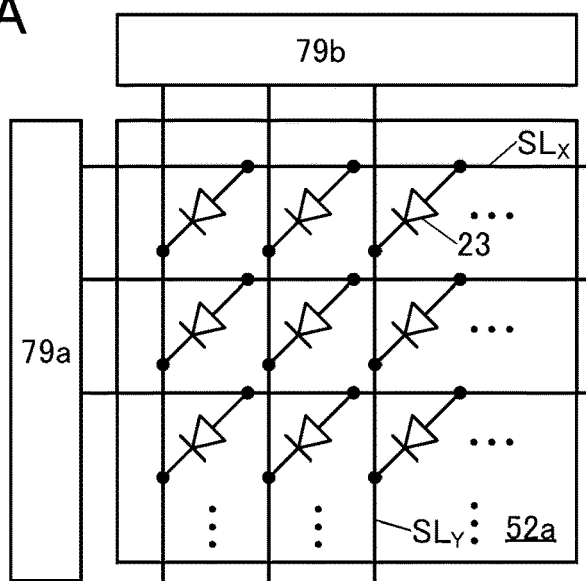
FIG. 6A to FIG. 6D are diagrams illustrating structure examples of display devices.

FIG. 6A illustrates an example of the case where a driving method with a passive matrix method is employed.

A display device illustrated in FIG. 6A includes a layer 52*a*, a circuit portion 79*a*, and a circuit portion 79*b*. A plurality of light-emitting elements 23 are arranged in a matrix in the layer 52*a*. The circuit portion 79*a* is electrically connected to anodes of a plurality of light-emitting elements 23 arranged in the row direction through a wiring SLx. The circuit portion 79*b* is electrically connected to cathodes of a plurality of light-emitting elements 23 in the column direction through a wiring SLY.

The light-emitting elements 23 can emit light with luminance corresponding to the difference between an anode potential supplied from the circuit portion 79*a* through the wiring SLx and a cathode potential supplied from the circuit portion 79*b* through the wiring SLY.

Figure 6B:
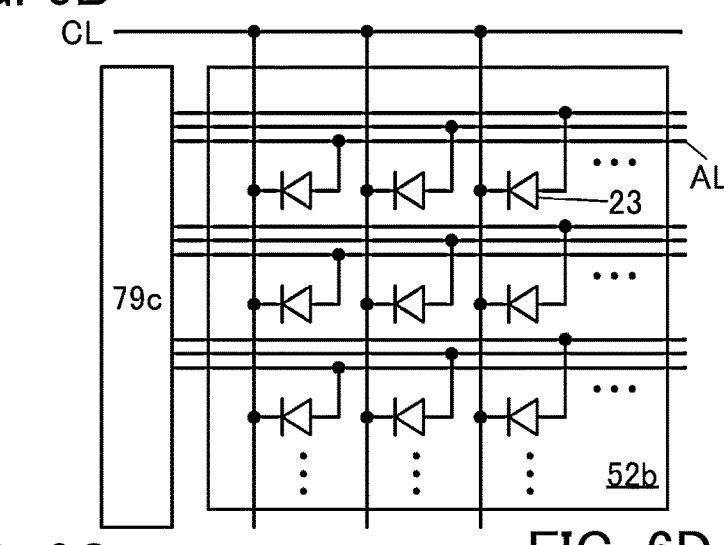

FIG. 6B illustrates an example of the case where a segment method is employed as the driving method.

A display device illustrated in FIG. 6B includes a layer 52*b* and a circuit portion 79*c*. The plurality of light-emitting elements 23 are arranged in a matrix in the layer 52*b*. A plurality of wirings AL are electrically connected to the circuit portion 79*c*. The anode of one light-emitting element 23 is electrically connected to one wiring AL. Anode potentials are supplied from the circuit portion 79*c* to the anodes of the light-emitting elements 23 through the wirings AL. The cathodes of the plurality of light-emitting elements 23 are electrically connected to the wiring CL. A cathode potential is supplied to the wiring CL.

With the structure illustrated in FIG. 6B, an anode potential is supplied to each of the light-emitting elements 23, so that the light-emitting elements 23 can be made to emit light.

Figure 6C:
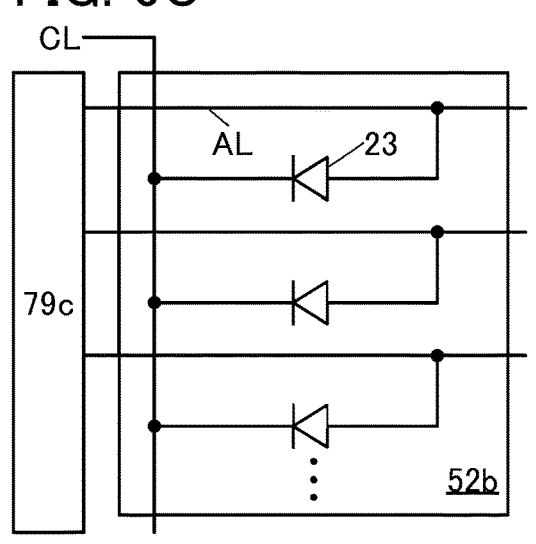

A display device illustrated in FIG. 6C includes the circuit portion 79*c* and the layer 52*c* including a plurality of light-emitting elements 23 arranged in the column direction. Anode potentials are supplied to the anodes of the light-emitting elements 23 from the circuit portion 79*c* through the wirings AL. Cathode potentials are supplied to the cathodes of the light-emitting elements 23 through the wiring CL.

A structure in which the light-emitting elements 23 each having a belt-shaped top surface are arranged in one direction can be suitably employed for the display device illustrated in FIG. 6C.

Figure 6D:
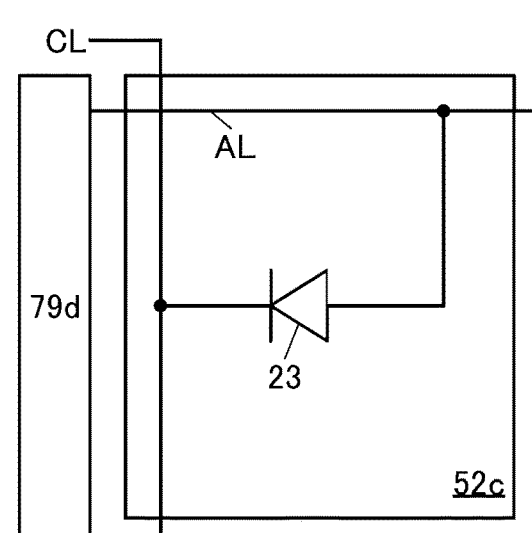

FIG. 6D illustrates an example of the case where one light-emitting element 23 is provided. One light-emitting element 23 is provided in the layer 52*c*. An anode potential is supplied from a circuit portion 79*d* to the anode of the light-emitting element 23 through the wiring AL, and a cathode potential is supplied to the cathode through the wiring CL.

Since the display device illustrated in FIG. 6D includes one light-emitting element 23, the circuit portion 79*d* controls the emission luminance (i.e., the level of an anode potential) and the timing of emitting light, whereby the circuit configuration can be simplified as compared with the above configuration.

Note that in FIG. 6A to FIG. 6D, the light-emitting element 23 denoted by one circuit symbol can be a plurality of light-emitting elements. For example, a plurality of light-emitting elements connected in series or in parallel can be regarded as one light-emitting element.

[Device Structure]

Next, detailed structures of the light-emitting element, the light-receiving element, and the light-emitting and light-receiving element which can be used in the display device of one embodiment of the present invention are described.

A light-emitting element described below as an example can be used as the light-emitting element 21 described above as an example. A light-receiving element and a light-emitting and light-receiving element described below as examples can be used as the light-receiving element 22 described above as an example. The light-emitting element described below as an example can be used as the light-emitting element 23.

The display device of one embodiment of the present invention can have any of the following structures: a top-emission structure in which light is emitted in a direction opposite to the substrate where the light-emitting elements are formed, a bottom-emission structure in which light is emitted toward the substrate where the light-emitting elements are formed, and a dual-emission structure in which light is emitted toward both surfaces.

In this embodiment, a top-emission display device is described as an example.

In this specification and the like, unless otherwise specified, in describing a structure including a plurality of components (e.g., light-emitting elements or light-emitting layers), alphabets are not added when a common part for the components is described. For example, when a common part of a light-emitting layer 283R, a light-emitting layer 283G, and the like is described, the light-emitting layers are simply referred to as a light-emitting layer 283, in some cases.

Figure 7A:
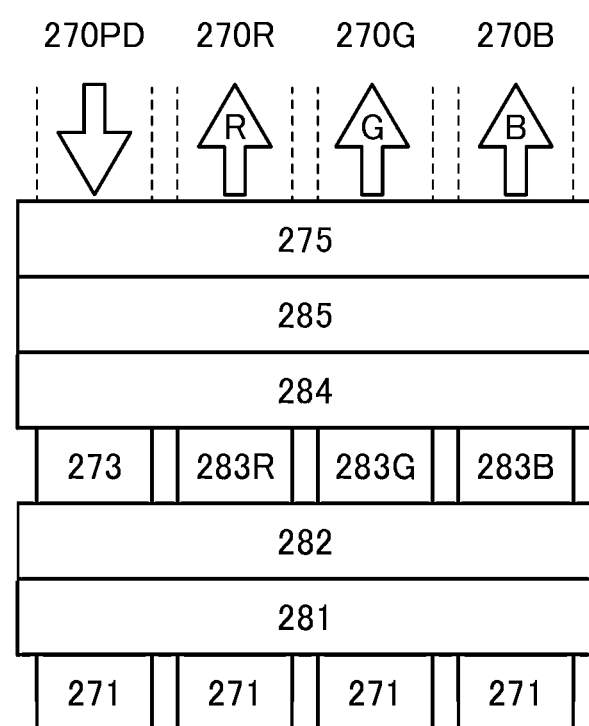
FIG. 7A and FIG. 7B are diagrams illustrating structure examples of display devices.

A display device 280A illustrated in FIG. 7A includes a light-receiving element 270PD, a light-emitting element 270R that emits red (R) light, a light-emitting element 270G that emits green (G) light, and a light-emitting element 270B that emits blue (B) light.

Each of the light-emitting elements includes a pixel electrode 271, a hole-injection layer 281, a hole-transport layer 282, a light-emitting layer, an electron-transport layer 284, an electron-injection layer 285, and a common electrode 275, which are stacked in this order. The light-emitting element 270R includes the light-emitting layer 283R, the light-emitting element 270G includes the light-emitting layer 283G, and the light-emitting element 270B includes a light-emitting layer 283B. The light-emitting layer 283R contains a light-emitting substance that emits red light, the light-emitting layer 283G contains a light-emitting substance that emits green light, and the light-emitting layer 283B contains a light-emitting substance that emits blue light.

The light-emitting elements are electroluminescent elements that emit light to the common electrode 275 side by voltage application between the pixel electrodes 271 and the common electrode 275.

The light-receiving element 270PD includes the pixel electrode 271, the hole-injection layer 281, the hole-transport layer 282, an active layer 273, the electron-transport layer 284, the electron-injection layer 285, and the common electrode 275, which are stacked in this order.

The light-receiving element 270PD is a photoelectric conversion element that receives light entering from the outside of the display device 280A and converts it into an electric signal.

In the description made in this embodiment, the pixel electrode 271 functions as an anode and the common electrode 275 functions as a cathode in both of the light-emitting element and the light-receiving element. In other words, when the light-receiving element is driven by application of reverse bias between the pixel electrode 271 and the common electrode 275, light incident on the light-receiving element can be detected and charge can be generated and extracted as current.

In the display device of this embodiment, an organic compound is used for the active layer 273 of the light-receiving element 270PD. In the light-receiving element 270PD, the layers other than the active layer 273 can have structures in common with the layers in the light-emitting elements. Therefore, the light-receiving element 270PD can be formed concurrently with the formation of the light-emitting elements only by adding a step of forming the active layer 273 in the manufacturing process of the light-emitting elements. The light-emitting elements and the light-receiving element 270PD can be formed over one substrate. Accordingly, the light-receiving element 270PD can be incorporated into the display device without a significant increase in the number of manufacturing steps.

The display device 280A is an example in which the light-receiving element 270PD and the light-emitting elements have a common structure except that the active layer 273 of the light-receiving element 270PD and the light-emitting layers 283 of the light-emitting elements are separately formed. Note that the structures of the light-receiving element 270PD and the light-emitting elements are not limited thereto. The light-receiving element 270PD and the light-emitting elements may include separately formed layers other than the active layer 273 and the light-emitting layers 283. The light-receiving element 270PD and the light-emitting elements preferably include at least one layer used in common (common layer). Thus, the light-receiving element 270PD can be incorporated into the display device without a significant increase in the number of manufacturing steps.

A conductive film that transmits visible light is used as the electrode through which light is extracted, which is either the pixel electrode 271 or the common electrode 275. A conductive film that reflects visible light is preferably used as the electrode through which light is not extracted.

The light-emitting elements included in the display device of this embodiment preferably employs a micro optical resonator (microcavity) structure. Thus, one of the pair of electrodes of the light-emitting elements is preferably an electrode having properties of transmitting and reflecting visible light (a semi-transmissive and semi-reflective electrode), and the other is preferably an electrode having a property of reflecting visible light (a reflective electrode). When the light-emitting elements have a microcavity structure, light obtained from the light-emitting layers can be resonated between both of the electrodes, whereby light emitted from the light-emitting elements can be intensified.

Note that the semi-transmissive and semi-reflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light with a wavelength greater than or equal to 400 nm and less than 750 nm) transmittance higher than or equal to 40% is preferably used in the light-emitting elements. The semi-transmissive and semi-reflective electrode has a visible light reflectance of higher than or equal to 10% and lower than or equal to 95%, preferably higher than or equal to 30% and lower than or equal to 80%. The reflective electrode has a visible light reflectance of higher than or equal to 40% and lower than or equal to 100%, preferably higher than or equal to 70% and lower than or equal to 100%. These electrodes preferably have a resistivity of $1\times10^{-2}$ $\Omega$cm or lower. Note that in the case where any of the light-emitting elements emits near-infrared light (light with a wavelength greater than or equal to 750 nm and less than or equal to 1300 nm), the near-infrared light transmittance and reflectance of these electrodes preferably satisfy the above-described numerical ranges of the visible light transmittance and reflectance.

The light-emitting element includes at least the light-emitting layer 283. The light-emitting element may further include, as a layer other than the light-emitting layer 283, a layer containing a substance with a high hole-injection property, a substance with a high hole-transport property, a hole-blocking material, a substance with a high electron-transport property, a substance with a high electron-injection property, an electron-blocking material, a substance with a bipolar property (a substance with a high electron- and hole-transport property), or the like.

For example, the light-emitting elements and the light-receiving element can share at least one of the hole-injection layer, the hole-transport layer, the electron-transport layer, and the electron-injection layer. Furthermore, at least one of the hole-injection layer, the hole-transport layer, the electron-transport layer, and the electron-injection layer can be separately formed for the light-emitting elements and the light-receiving element.

The hole-injection layer is a layer injecting holes from an anode to the hole-transport layer, and a layer containing a material with a high hole-injection property. As the material with a high hole-injection property, an aromatic amine compound or a composite material containing a hole-transport material and an acceptor material (electron-accepting material) can be used.

In the light-emitting element, the hole-transport layer is a layer transporting holes, which are injected from the anode by the hole-injection layer, to the light-emitting layer. In the light-receiving element, the hole-transport layer is a layer transporting holes, which are generated in the active layer on the basis of incident light, to the anode. The hole-transport layer is a layer containing a hole-transport material. As the hole-transport material, a substance having a hole mobility greater than or equal to $1\times10^{-6}$ cm$^2$/Vs is preferable. Note that other substances can also be used as long as they have a property of transporting more holes than electrons. As the hole-transport material, a material having a high hole-transport property, such as a $\pi$-electron-rich heteroaromatic compound (e.g., a carbazole derivative, a thiophene derivative, and a furan derivative) or an aromatic amine (a compound having an aromatic amine skeleton), is preferable.

In the light-emitting element, the electron-transport layer is a layer transporting electrons, which are injected from the cathode by the electron-injection layer, to the light-emitting layer. In the light-receiving element, the electron-transport layer is a layer transporting electrons, which are generated in the active layer on the basis of incident light, to the cathode. The electron-transport layer is a layer containing an electron-transport material. As the electron-transport material, a substance having an electron mobility greater than or equal to $1\times10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a x-electron deficient heteroaromatic compound such as a nitrogen-containing heteroaromatic compound.

The electron-injection layer is a layer injecting electrons from a cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The light-emitting layer 283 is a layer containing a light-emitting substance. The light-emitting layer 283 can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer 283 may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer 283 preferably contains a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps the wavelength of a lowest-energy-side absorption band of the light-emitting substance, energy can be transferred smoothly and light emission can be obtained efficiently. With this structure, high efficiency, low-voltage driving, and a long lifetime of the light-emitting element can be achieved at the same time.

In the combination of materials for forming an exciplex, the HOMO level (highest occupied molecular orbital level) of the hole-transport material is preferably higher than or equal to the HOMO level of the electron-transport material. The LUMO level (lowest unoccupied molecular orbital level) of the hole-transport material is preferably higher than or equal to the LUMO level of the electron-transport material. The LUMO levels and the HOMO levels of the materials can be derived from the electrochemical characteristics (reduction potentials and oxidation potentials) of the materials that are measured by cyclic voltammetry (CV).

Note that the formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectra of the hole-transport material, the electron-transport material, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

The active layer 273 includes a semiconductor. Examples of the semiconductor include an inorganic semiconductor such as silicon and an organic semiconductor containing an organic compound. This embodiment shows an example in which an organic semiconductor is used as the semiconductor included in the active layer 273. The use of an organic semiconductor is preferable because the light-emitting layer 283 and the active layer 273 can be formed by the same method (e.g., a vacuum evaporation method) and thus the same manufacturing apparatus can be used.

Examples of an n-type semiconductor material contained in the active layer 273 are electron-accepting organic semiconductor materials such as fullerene (e.g., $C_{60}$ and $C_{70}$) and a fullerene derivative. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electrons widely spread in fullerene having a spherical shape, its electron-accepting property is high. The high electron-accepting property efficiently causes rapid charge separation and is useful for a light-receiving element. Both $C_{60}$ and $C_{70}$ have a wide absorption band in the visible light region, and $C_{70}$ is especially preferable because of having a larger π-electron conjugation system and a wider absorption band in the long wavelength region than $C_{60}$.

Examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer 273 include electron-donating organic semiconductor materials such as copper (II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can improve the carrier-transport property.

For example, the active layer 273 is preferably formed by co-evaporation of an n-type semiconductor and a p-type semiconductor. Alternatively, the active layer 273 may be formed by stacking an n-type semiconductor and a p-type semiconductor.

Either a low molecular compound or a high molecular compound can be used for the light-emitting element and the light-receiving element, and an inorganic compound may be contained. Each of the layers included in the light-emitting element and the light-receiving element can be formed by an evaporation method (including a vacuum evaporation method), a transfer method, a printing method, an inkjet method, a coating method, or the like.

Figure 7B:
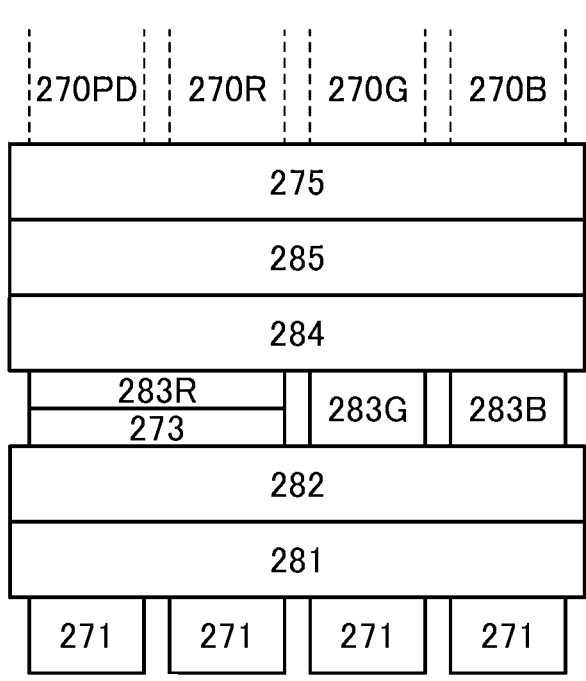

A display device 280B illustrated in FIG. 7B is different from the display device 280A in that the light-receiving element 270PD and the light-emitting element 270R have the same structure.

The light-receiving element 270PD and the light-emitting element 270R share the active layer 273 and the light-emitting layer 283R.

Here, it is preferable that the light-receiving element 270PD have a structure in common with the light-emitting element that emits light with a wavelength longer than that of the light desired to be detected. For example, the light-receiving element 270PD having a structure in which blue light is detected can have a structure which is similar to that of one or both of the light-emitting element 270R and the light-emitting element 270G. For example, the light-receiving element 270PD having a structure in which green light is detected can have a structure similar to that of the light-emitting element 270R.

When the light-receiving element 270PD and the light-emitting element 270R have a common structure, the number of deposition steps and the number of masks can be smaller than those for the structure in which the light-receiving element 270PD and the light-emitting element 270R include separately formed layers. As a result, the number of manufacturing steps and the manufacturing cost of the display device can be reduced.

When the light-receiving element 270PD and the light-emitting element 270R have a common structure, a margin for misalignment can be narrower than that for the structure in which the light-receiving element 270PD and the light-emitting element 270R include separately formed layers. Accordingly, the aperture ratio of a pixel can be increased, so that the light extraction efficiency of the display device can be increased. This can extend the life of the light-emitting element. Furthermore, the display device can exhibit a high luminance. Moreover, the resolution of the display device can also be increased.

The light-emitting layer 283R contains a light-emitting material that emits red light. The active layer 273 contains an organic compound that absorbs light with a wavelength shorter than that of red light (e.g., one or both of green light and blue light). The active layer 273 preferably contains an organic compound that does not easily absorb red light and that absorbs light with a wavelength shorter than that of red light. In this way, red light can be efficiently extracted from the light-emitting element 270R, and the light-receiving element 270PD can detect light with a wavelength shorter than that of red light at high accuracy.

Although the light-emitting element 270R and the light-receiving element 270PD have the same structure in an example of the display device 280B, the light-emitting element 270R and the light-receiving element 270PD may include optical adjustment layers with different thicknesses.

A display device 280C illustrated in FIG. 8A and FIG. 8B includes a light-emitting and light-emitting and light-receiving element 270SR that emits red (R) light and has a light-receiving function, the light-emitting element 270G, and the light-emitting element 270B. The above description of the display device 280A and the like can be referred to for the structures of the light-emitting element 270G and the light-emitting element 270B.

The light-emitting and light-receiving element 270SR includes the pixel electrode 271, the hole-injection layer 281, the hole-transport layer 282, the active layer 273, the light-emitting layer 283R, the electron-transport layer 284, the electron-injection layer 285, and the common electrode 275, which are stacked in this order. The light-emitting and light-receiving element 270SR has the same structure as the light-emitting element 270R and the light-receiving element 270PD in the display device 280B.

FIG. 8A illustrates a case where the light-emitting and light-receiving element 270SR functions as a light-emitting element. In the example of FIG. 8A, the light-emitting element 270B emits blue light, the light-emitting element 270G emits green light, and the light-emitting and light-receiving element 270SR emits red light.

FIG. 8B illustrates a case where the light-emitting and light-receiving element 270SR functions as a light-receiving element. In the example of FIG. 8B, the light-emitting and light-receiving element 270SR receives blue light emitted by the light-emitting element 270B and green light emitted by the light-emitting element 270G.

The light-emitting element 270B, the light-emitting element 270G, and the light-emitting and light-receiving element 270SR each include the pixel electrode 271 and the common electrode 275. In this embodiment, the case where the pixel electrode 271 functions as an anode and the common electrode 275 functions as a cathode is described as an example. When the light-emitting and light-receiving element 270SR is driven by application of reverse bias between the pixel electrode 271 and the common electrode 275, light incident on the light-emitting and light-receiving element 270SR can be detected and charge can be generated and extracted as current.

It can be said that the light-emitting and light-receiving element 270SR has a structure in which the active layer 273 is added to the light-emitting element. That is, the light-emitting and light-receiving element 270SR can be formed concurrently with the formation of the light-emitting element only by adding a step of forming the active layer 273 in the manufacturing process of the light-emitting element. The light-emitting element and the light-emitting and light-receiving element can be formed over one substrate. Thus, the display portion can be provided with one or both of an image capturing function and a sensing function without a significant increase in the number of manufacturing steps.

The stacking order of the light-emitting layer 283R and the active layer 273 is not limited. FIG. 8A and FIG. 8B each illustrate an example in which the active layer 273 is provided over the hole-transport layer 282, and the light-emitting layer 283R is provided over the active layer 273. The stacking order of the light-emitting layer 283R and the active layer 273 may be reversed.

The light-emitting and light-receiving element may exclude at least one layer of the hole-injection layer 281, the hole-transport layer 282, the electron-transport layer 284, and the electron-injection layer 285. Furthermore, the light-emitting and light-receiving element may include another functional layer such as a hole-blocking layer or an electron-blocking layer.

In the light-emitting and light-receiving element, a conductive film that transmits visible light is used as the electrode through which light is extracted. A conductive film that reflects visible light is preferably used as the electrode through which light is not extracted.

The functions and materials of the layers included in the light-emitting and light-receiving element are similar to those of the layers included in the light-emitting elements and the light-receiving element and are not described in detail.

FIG. 8C to FIG. 8G illustrate examples of stacked-layer structures of light-emitting and light-receiving elements.

The light-emitting and light-receiving element illustrated in FIG. 8C includes a first electrode 277, the hole-injection layer 281, the hole-transport layer 282, the light-emitting layer 283R, the active layer 273, the electron-transport layer 284, the electron-injection layer 285, and a second electrode 278.

FIG. 8C illustrates an example in which the light-emitting layer 283R is provided over the hole-transport layer 282, and the active layer 273 is stacked over the light-emitting layer 283R.

As illustrated in FIG. 8A to FIG. 8C, the active layer 273 and the light-emitting layer 283R may be in contact with each other.

A buffer layer is preferably provided between the active layer 273 and the light-emitting layer 283R. In this case, the buffer layer preferably has a hole-transport property and an electron-transport property. For example, a substance with a bipolar property is preferably used for the buffer layer. Alternatively, as the buffer layer, at least one layer of a hole-injection layer, a hole-transport layer, an electron-transport layer, an electron-injection layer, a hole-blocking layer, an electron-blocking layer, and the like can be used. FIG. 8D illustrates an example in which the hole-transport layer 282 is used as the buffer layer.

The buffer layer provided between the active layer 273 and the light-emitting layer 283R can inhibit transfer of excitation energy from the light-emitting layer 283R to the active layer 273. Furthermore, the buffer layer can also be used to adjust the optical path length (cavity length) of the microcavity structure. Thus, high emission efficiency can be obtained from a light-emitting and light-receiving element including the buffer layer between the active layer 273 and the light-emitting layer 283R.

FIG. 8E illustrates an example of a stacked-layer structure in which a hole-transport layer 282-1, the active layer 273, a hole-transport layer 282-2, and the light-emitting layer 283R are stacked in this order over the hole-injection layer 281. The hole-transport layer 282-2 functions as a buffer layer. The hole-transport layer 282-1 and the hole-transport layer 281-2 may contain the same material or different materials. Instead of the hole-transport layer 281-2, any of the above layers that can be used as the buffer layer may be used. The positions of the active layer 273 and the light-emitting layer 283R may be interchanged.

The light-emitting and light-receiving element illustrated in FIG. 8F is different from the light-emitting and light-receiving element illustrated in FIG. 8A in not including the hole-transport layer 282. In this manner, the light-emitting and light-receiving element may exclude at least one layer of the hole-injection layer 281, the hole-transport layer 282, the electron-transport layer 284, and the electron-injection layer 285. Furthermore, the light-emitting and light-receiving element may include another functional layer such as a hole-blocking layer or an electron-blocking layer.

The light-emitting and light-receiving element illustrated in FIG. 8G is different from the light-emitting and light-receiving element illustrated in FIG. 8A in including a layer 289 serving as both a light-emitting layer and an active layer instead of including the active layer 273 and the light-emitting layer 283R.

As the layer 289 serving as both a light-emitting layer and an active layer, a layer containing three materials which are an n-type semiconductor that can be used for the active layer 273, a p-type semiconductor that can be used for the active layer 273, and a light-emitting substance that can be used for the light-emitting layer 283R can be used, for example.

Note that an absorption band on the lowest energy side of an absorption spectrum of a mixed material of the n-type semiconductor and the p-type semiconductor and a maximum peak of an emission spectrum (PL spectrum) of the light-emitting substance preferably do not overlap with each other and are further preferably positioned fully apart from each other.

Structure Example 4 of Display Device

A more specific structure of the display device of one embodiment of the present invention is described below. FIG. 9 illustrates a perspective view of a display device 200, and FIG. 10A illustrates a cross-sectional view of the display device 200.

In the display device 200, a substrate 151 and a substrate 152 are bonded to each other. In FIG. 9, the substrate 152 is denoted by a dashed line.

The display device 200 includes a display portion 262, a circuit 264, a wiring 265, and the like. FIG. 9 illustrates an example in which the display device 200 is provided with an IC (integrated circuit) 274 and an FPC 272. Thus, the structure illustrated in FIG. 9 can also be regarded as a display module including the display device 200, the IC, and the FPC.

As the circuit 264, for example, a scan line driver circuit can be used.

The wiring 265 has a function of supplying a signal and power to the display portion 262 and the circuit 264. The signal and power are input to the wiring 265 from the outside through the FPC 272 or input to the wiring 265 from the IC 274.

FIG. 9 illustrates an example in which the IC 274 is provided over the substrate 151 by a COG (Chip On Glass) method, a COF (Chip On Film) method, or the like. An IC including a scan line driver circuit, a signal line driver circuit, or the like can be used as the IC 274, for example. Note that the display device 200 and the display module are not necessarily provided with an IC. The IC may be mounted on the FPC by a COF method or the like.

FIG. 10A illustrates an example of cross-sections of part of a region including the FPC 272, part of a region including the circuit 264, part of a region including the display portion 262, and part of a region including an end portion of the display device 200 illustrated in FIG. 9.

The display device 200 illustrated in FIG. 10A includes a transistor 208, a transistor 209, a transistor 210, the light-emitting element 190, the light-receiving element 110, the light-emitting element 160, and the like between the substrate 151 and the substrate 152.

The transistor 208, the transistor 209, and the transistor 210 are formed over the substrate 151. These transistors can be formed using the same materials in the same steps.

The transistor 208, the transistor 209, and the transistor 210 each include a conductive layer 221 functioning as a gate, an insulating layer 211 functioning as a gate insulating layer, a semiconductor layer including a channel formation region 231i and a pair of low-resistance regions 231n, a conductive layer 222a connected to one of the pair of low-resistance regions 231n, a conductive layer 222b connected to the other of the pair of low-resistance regions 231n, an insulating layer 225 functioning as a gate insulating layer, a conductive layer 223 functioning as a gate, and an insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the corresponding low-resistance regions 23 In through openings provided in the insulating layer 225 and the insulating layer 215. One of the conductive layer 222a and the conductive layer 222b functions as a source, and the other functions as a drain.

There is no particular limitation on the structure of the transistors included in the display device of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 208, the transistor 209, and the transistor 210. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

A semiconductor layer of the transistor preferably contains a metal oxide (also referred to as an oxide semiconductor). Alternatively, the semiconductor layer of the transistor may contain silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In—M—Zn oxide, a sputtering target used for depositing the In—M—Zn oxide preferably has the atomic ratio of In higher than or equal to the atomic ratio of M. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=10:1:3, In:M:Zn=6:1:6, and In:M:Zn=5:2:5.

A target containing a polycrystalline oxide is preferably used as the sputtering target, in which case the semiconductor layer having crystallinity is easily formed. Note that the atomic ratio in the formed semiconductor layer may vary from the above atomic ratio between metal elements in the sputtering target in a range of ±40%. For example, in the case where the composition of a sputtering target used for the semiconductor layer is In:Ga:Zn=4:2:4.1 [atomic ratio], the composition of the semiconductor layer to be formed is in some cases in the neighborhood of In:Ga:Zn=4:2:3 [atomic ratio].

Note that when the atomic ratio is described as In:Ga:Zn=4:2:3 or in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or in the neighborhood thereof, the case is included where Ga is greater than 0.1 and less than or equal to 2 and Zn is greater than or equal to 5 and less than or equal to 7 with In being 5. When the atomic ratio is described as In:Ga:Zn=1:1:1 or in the neighborhood thereof, the case is included where Ga is greater than 0.1 and less than or equal to 2 and Zn is greater than 0.1 and less than or equal to 2 with In being 1.

The transistor included in the circuit 264 and the transistor included in the display portion 262 may have the same structure or different structures. A plurality of transistors included in the circuit 264 may have the same structure or two or more kinds of structures. Similarly, a plurality of transistors included in the display portion 262 may have the same structure or two or more kinds of structures.

The insulating layer 214 is provided to cover the transistors and has a function of a planarization layer. Note that there is no limitation on the number of gate insulating layers and the number of insulating layers covering the transistors, and each insulating layer may have either a single layer or two or more layers.

A material into which impurities such as water or hydrogen do not easily diffuse is preferably used for at least one of the insulating layers that cover the transistors. This allows the insulating layer to function as a barrier layer. Such a structure can effectively inhibit diffusion of impurities into the transistors from the outside and increase the reliability of the display device.

FIG. 10A illustrates an example in which the insulating layer 225 covers a top surface and side surfaces of the semiconductor layer. Meanwhile, in a transistor 202 illustrated in FIG. 10B, the insulating layer 225 overlaps with the channel formation region 231*i* of a semiconductor layer 231 and does not overlap with the low-resistance regions 231*n*. The structure illustrated in FIG. 10B can be manufactured by processing the insulating layer 225 using the conductive layer 223 as a mask, for example. In FIG. 10B, the insulating layer 215 is provided to cover the insulating layer 225 and the conductive layer 223, and the conductive layer 222*a* and the conductive layer 222*b* are connected to the low-resistance regions 231*n* through the openings in the insulating layer 215. Furthermore, an insulating layer 218 covering the transistor may be provided.

An inorganic insulating film is preferably used as each of the insulating layer 211, the insulating layer 225, and the insulating layer 215. As the inorganic insulating film, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

Here, an organic insulating film often has a lower barrier property than an inorganic insulating film. Therefore, the organic insulating film preferably has an opening in the vicinity of an end portion of the display device 200. This can inhibit diffusion of impurities from the end portion of the display device 200 through the organic insulating film. Alternatively, in order to prevent the organic insulating film from being exposed at the end portion of the display device 200, the organic insulating film may be formed so that its end portion is positioned on the inner side than the end portion of the display device 200.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 10A, an opening is formed in the insulating layer 214. This can inhibit diffusion of impurities into the display portion 262 from the outside through the insulating layer 214 even when an organic insulating film is used as the insulating layer 214. Thus, the reliability of the display device 200 can be increased.

The light-emitting element 190 has a stacked-layer structure in which the pixel electrode 191, a common layer 114, a light-emitting layer 196, a common layer 115, and the common electrode 113 are stacked in this order from the insulating layer 214 side. The pixel electrode 191 of the light-emitting element 190 is electrically connected to one of the pair of low-resistance regions 231*n* of the transistor 208 through the conductive layer 222*b*. The transistor 208 has a function of controlling the driving of the light-emitting element 190. The end portions of the pixel electrode 191 are covered with the partition 216. The pixel electrode 191 contains a material that reflects visible light, and the common electrode 113 contains a material that transmits visible light.

The light-receiving element 110 has a stacked-layer structure in which the pixel electrode 111, the common layer 114, an active layer 116, the common layer 115, and the common electrode 113 are stacked in this order from the insulating layer 214 side. The pixel electrode 111 of the light-receiving element 110 is electrically connected to the other of the pair of low-resistance regions 23 In of the transistor 209 through the conductive layer 222*b*. The end portions of the pixel electrode 111 are covered with the partition 216. The pixel electrode 111 contains a material that reflects visible light and infrared light, and the common electrode 113 contains a material that transmits visible light and infrared light. Light emitted by the light-emitting element 190 is emitted toward the substrate 152 side. Light enters the light-receiving element 110 through the substrate 152. For the substrate 152, a material that has high visible-light- and infrared-light-transmitting properties is preferably used.

The pixel electrode 111 and the pixel electrode 191 can be formed using the same material in the same step. The common layer 114, the common layer 115, and the common electrode 113 are used in both the light-receiving element 110 and the light-emitting element 190. The light-receiving element 110 and the light-emitting element 190 can have common components except the active layer 116 and the light-emitting layer 196. Thus, the light-receiving element 110 can be incorporated into the display device 200 without a significant increase in the number of manufacturing steps.

An inorganic insulating layer 195*a*, an organic insulating layer 195*b*, and an inorganic insulating layer 195*c* are stacked to cover the light-receiving element 110 and the light-emitting element 190. The light-blocking layer 145 and the light-emitting element 160 are stacked over the inorganic insulating layer 195*c*. The light-blocking layer 145 and the light-emitting element 160 are each provided at a position overlapping with neither a light-receiving region of the light-receiving element 110 nor a light-emitting region of the light-emitting element 190.

In the display device 200, the organic insulating layer 195*b* corresponds to the resin layer 141.

An end portion of the inorganic insulating layer 195*a* and an end portion of the inorganic insulating layer 195*c* extend beyond an end portion of the organic insulating layer 195*b* and are in contact with each other. The inorganic insulating layer 195*a* is in contact with the insulating layer 215 (inorganic insulating layer) through the opening in the insulating layer 214 (organic insulating layer). Accordingly, the light-receiving element 110 and the light-emitting element 190 can be surrounded by the insulating layer 215 and the protective layer 195, whereby the reliability of the light-receiving element 110 and the light-emitting element 190 can be increased.

As described above, the protective layer 195 may have a stacked-layer structure of an organic insulating film and an inorganic insulating film. In that case, an end portion of the inorganic insulating film preferably extends beyond an end portion of the organic insulating film.

The light-blocking layer 145 has openings at a position overlapping with the light-receiving element 110 and at a position overlapping with the light-emitting element 190. Providing the light-blocking layer 145 can control the range where the light-receiving element 110 detects light. Furthermore, with the light-blocking layer 145, light from the light-emitting element 190 and the light-emitting element 160 can be inhibited from directly entering the light-receiving element 110. Hence, a sensor with less noise and high sensitivity can be obtained.

The light-emitting element 160 has a stacked-layer structure in which the electrode 161, a buffer layer 164, a light-emitting layer 166, a buffer layer 165, and the electrode 163 are stacked in this order from the light-blocking layer 145 side. End portions of the electrode 161 are covered with the insulating layer 217. The electrode 161 contains a material that reflects infrared light, and the electrode 163 contains a material that transmits visible light and infrared light.

Each of the buffer layer 164, the light-emitting layer 166, and the buffer layer 165 includes an island-shaped top surface. The electrode 163 is provided to cover the buffer layer 164, the light-emitting layer 166, and the buffer layer 165. The buffer layer 164, the light-emitting layer 166, the buffer layer 165, and the electrode 163 are each provided at a position overlapping with neither the light-receiving region of the light-receiving element 110 nor the light-emitting region of the light-emitting element 190.

The resin layer 142 is provided to cover the insulating layer 217 and the light-emitting element 160, and the substrate 152 is provided over the resin layer 142. The resin layer 142 functions as an adhesive layer for bonding the substrate 151 to the substrate 152.

A connection portion 204 is provided in a region of the substrate 151 that does not overlap with the substrate 152. In the connection portion 204, the wiring 265 is electrically connected to the FPC 272 through a conductive layer 266 and a connection layer 242. On a top surface of the connection portion 204, the conductive layer 266 obtained by processing the same conductive film as the pixel electrode 191 is exposed. Thus, the connection portion 204 and the FPC 272 can be electrically connected to each other through the connection layer 242.

A variety of optical members can be arranged on the outer side of the substrate 152. Examples of the optical members include a polarizing plate, a retardation plate, a light diffusion layer (a diffusion film or the like), an anti-reflective layer, and a light-condensing film. Furthermore, an antistatic film preventing the attachment of dust, a water repellent film inhibiting the attachment of stain, a hard coat film inhibiting generation of a scratch caused by the use, a shock absorption layer, or the like may be placed on the outer side of the substrate 152.

For each of the substrate 151 and the substrate 152, glass, quartz, ceramic, sapphire, a resin, or the like can be used. When a flexible material is used for the substrate 151 and the substrate 152, the flexibility of the display device can be increased.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer 242, an anisotropic conductive film (ACF), an anisotropic conductive paste (ACP), or the like can be used.

Here, top-emission light-emitting elements are used as the light-emitting element 190 and the light-emitting element 160; however, there are top-emission, bottom-emission, and dual-emission light-emitting elements, for example. A conductive film that transmits visible light is used as the electrode through which light is extracted. A conductive film that reflects visible light is preferably used as the electrode through which light is not extracted.

The light-emitting element includes at least the light-emitting layer. The light-emitting element may further include, as a layer other than the light-emitting layer, a layer containing a substance with a high hole-injection property, a substance with a high hole-transport property, a hole-blocking material, a substance with a high electron-transport property, an electron-blocking material, a substance with a bipolar property (a substance with a high electron- and hole-transport property), or the like. For example, the common layer on the pixel electrode side preferably includes one or both of a hole-injection layer and a hole-transport layer. For example, the common layer on the common electrode side preferably includes one or both of an electron-transport layer and an electron-injection layer.

Either a low molecular compound or a high molecular compound can be used for the common layers and the light-emitting layer, and an inorganic compound may be contained.

Each of the layers included in the common layers and the light-emitting layer can be formed by an evaporation method (including a vacuum evaporation method), a transfer method, a printing method, an inkjet method, a coating method, or the like.

The light-emitting layer may contain an inorganic compound such as quantum dots as a light-emitting material.

The active layer 116 of the light-receiving element 110 includes a semiconductor. Examples of the semiconductor include an inorganic semiconductor such as silicon and an organic semiconductor containing an organic compound. This embodiment shows an example in which an organic semiconductor is used as the semiconductor included in the active layer. The use of an organic semiconductor is preferable because the light-emitting layer 196 of the light-emitting element 190 and the active layer 116 of the light-receiving element 110 can be formed by the same method (e.g., a vacuum evaporation method) and thus the same manufacturing apparatus can be used.

Examples of an n-type semiconductor material contained in the active layer 116 are electron-accepting organic semiconductor materials such as fullerene (e.g., $C_{60}$ and $C_{70}$) and a fullerene derivative. Fullerene has a soccer ball-like shape, which is energetically stable. Both the HOMO level and the LUMO level of fullerene are deep (low). Having a deep LUMO level, fullerene has an extremely high electron-accepting property (acceptor property). When T-electron conjugation (resonance) spreads in a plane as in benzene, the electron-donating property (donor property) usually increases. Although π-electrons widely spread in fullerene having a spherical shape, its electron-accepting property is high. The high electron-accepting property efficiently causes rapid charge separation and is useful for a light-receiving element. Both $C_{60}$ and $C_{70}$ have a wide absorption band in the visible light region, and $C_{70}$ is especially preferable because of having a larger π-electron conjugation system and a wider absorption band in the long wavelength region than $C_{60}$.

Examples of the n-type semiconductor material contained in the active layer 116 include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer 116 include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

For example, the active layer 116 is preferably formed by co-evaporation of an n-type semiconductor and a p-type semiconductor. Alternatively, the active layer 116 may be formed by stacking an n-type semiconductor and a p-type semiconductor.

Examples of materials that can be used for a gate, a source, and a drain of a transistor and conductive layers such as a variety of wirings and electrodes included in a display device include metals such as aluminum, titanium, chromium, nickel, copper, yttrium, zirconium, molybdenum, silver, tantalum, and tungsten, and an alloy containing any of these metals as its main component. A film containing any of these materials can be used as a single layer or in a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked-layer film of any of the above materials can be used as a conductive layer. For example, a stacked-layer film of indium tin oxide and an alloy of silver and magnesium, or the like is preferably used for increased conductivity. These materials can also be used for conductive layers such as a variety of wirings and electrodes included in a display device, or conductive layers (conductive layers functioning as a pixel electrode or a common electrode) included in a display element.

Examples of an insulating material that can be used for each insulating layer include a resin such as an acrylic resin and an epoxy resin, and an inorganic insulating material such as silicon oxide, silicon oxynitride, silicon nitride oxide, silicon nitride, aluminum oxide, and hafnium oxide.
[Metal Oxide]

A metal oxide that can be used for the semiconductor layer will be described below.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Note that in this specification and the like, CAAC (c-axis aligned crystal) or CAC (Cloud-Aligned Composite) may be stated. CAAC refers to an example of a crystal structure, and CAC refers to an example of a function or a material composition.

For example, a CAC (Cloud-Aligned Composite)-OS (Oxide Semiconductor) can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

Oxide semiconductors (metal oxides) are classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, or the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In, M, Zn) layer. Furthermore, when indium in the In layer is replaced with the element M, the layer can be referred to as an (In,M) layer.

The CAAC-OS is a metal oxide with high crystallinity. On the other hand, a clear crystal grain boundary is difficult to observe in the CAAC-OS; thus, it can be said that a reduction in electron mobility due to the crystal grain boundary is unlikely to occur. Entry of impurities, formation of defects, or the like might decrease the crystallinity of a metal oxide; thus, it can be said that the CAAC-OS is a metal oxide that has small amounts of impurities or defects (e.g., oxygen vacancies (also referred to as $V_O$)). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that indium-gallium-zinc oxide (hereinafter, IGZO), which is a kind of metal oxide containing indium, gallium, and zinc, has a stable structure in some cases by being formed of the above-described nanocrystals. In particular, crystals of IGZO tend not to grow in the air and thus, a stable structure might be obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures that show different properties. Two or more of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be formed using either or both of an inert gas and an oxygen gas. Note that there is no particular limitation on the flow rate ratio of oxygen (the partial pressure of oxygen) at the time of forming the metal oxide film. However, to obtain a transistor having high field-effect mobility, the flow rate ratio of oxygen (the partial pressure of oxygen) at the time of forming the metal oxide film is preferably higher than or equal to 0% and lower than or equal to 30%, further preferably higher than or equal to 5% and lower than or equal to 30%, and still further preferably higher than or equal to 7% and lower than or equal to 15%.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The substrate temperature during the formation of the metal oxide film is preferably lower than or equal to 350° C., further preferably higher than or equal to room temperature and lower than or equal to 200° C., and still further preferably higher than or equal to room temperature and lower than or equal to 130° C. The substrate temperature during the formation of the metal oxide film is preferably room temperature because productivity can be increased.

The metal oxide film can be formed by a sputtering method. Alternatively, a PLD method, a PECVD method, a thermal CVD method, an ALD method, or a vacuum evaporation method, for example, may be used.

The above is the description of the metal oxide.

The display device of this embodiment includes a light-receiving element and a light-emitting element in a display portion, and the display portion has both a function of displaying an image and a function of detecting light. Thus, the size and weight of an electronic device can be reduced as compared to the case where a sensor is provided outside a display portion or outside a display device. Moreover, an electronic device having more functions can be achieved by a combination of the display device of this embodiment and a sensor provided outside the display portion or outside the display device.

In the light-receiving element, at least one of the layers other than the active layer can have a structure in common with a layer in the light-emitting element (EL element). Also in the light-receiving element, all of the layers other than the active layer can have structures in common with the layers in the light-emitting element (EL element). For example, the light-emitting element and the light-receiving element can be formed over one substrate only by adding a step of forming the active layer in the manufacturing process of the light-emitting element. In the light-receiving element and the light-emitting element, their pixel electrodes can be formed using the same material in the same step, and their common electrodes can be formed using the same material in the same step. When a circuit electrically connected to the light-receiving element and a circuit electrically connected to the light-emitting element are formed using the same materials in the same steps, the manufacturing process of the display device can be simplified. In such a manner, a display device that incorporates a light-receiving element and is highly convenient can be manufactured without complicated steps.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 2

In this embodiment, electronic devices of one embodiment of the present invention is described.

Structure Example of Electronic Device

The display device of one embodiment of the present invention can obtain a variety of biological data with the use of infrared light and visible light. Such biological data can be used for both user's personal authentication uses and health care uses.

Typical examples of biological data that can be obtained using the display device of one embodiment of the present invention and can be used for personal authentication include data on a fingerprint, a palm print, a vein, an iris, and the like. Such biological data can be obtained using visible light or infrared light. It is particularly preferable that data on a vein and an iris be obtained using infrared light.

Examples of biological data that can be obtained using the display device of one embodiment of the present invention and can be used for health care uses include data on the pulse wave, the blood sugar level, oxygen saturation, the neutral fat concentration, and the like.

Furthermore, a unit for obtaining another biological data is preferably provided in an electronic device including the display device. Examples of such biological data include internal biological data on an electrocardiogram, blood pressure, the body temperature, and the like and superficial biological data on facial expression, complexion, a pupil, and the like. In addition, data on the number of steps taken, exercise intensity, a height difference in a movement, and a meal (e.g., calorie intake or nutrients) are important for health care. The use of a plurality of kinds of biological data and the like enables complex management of physical conditions, leading to not only daily health management but also early detection of injuries and diseases.

Blood pressure can be calculated from an electrocardiogram and a difference in timing of two pulsations of a pulse wave (a period of pulse wave propagation time), for example. High blood pressure results in a short pulse wave propagation time, whereas low blood pressure results in a long pulse wave propagation time. The body conditions of a user can be estimated from a relationship between the heart rate and blood pressure that is calculated from an electrocardiogram and a pulse wave. For example, when both the heart rate and blood pressure are high, the user can be estimated to be nervous or excited, whereas when both the heart rate and blood pressure are low, the user can be estimated to be relaxed. When the state where blood pressure is low and the heart rate is high is continued, the user might suffer from a heart disease or the like.

The user can check the biological data measured with the electronic device, or one's own body conditions or the like estimated on the basis of the data at any time; thus, health awareness is improved. As a result, the user can reconsider the daily habits to avoid over-eating and over-drinking, get enough exercise, or manage one's physical conditions, for example. Furthermore, the user can be inspired to have a medical examination at a medical institution as necessary.

Structure Example 1

FIG. 11A illustrates a schematic diagram of an electronic device 80. The electronic device 80 can be used as a smartphone. The electronic device 80 includes at least a housing 82, a display portion 81a, and a display portion 81b. The display portion 81a functions as a main display surface. The display portion 81b functions as a sub display surface and has a curved surface shape along a side surface of the housing 82. A display device of one embodiment of the present invention is used in the display portion 81a and the display portion 81b.

As illustrated in FIG. 11A, the display portion 81b is provided at a position that is naturally touched by the finger 60 when the user grasps the electronic device 80 with a hand 60a. In this case, the electronic device 80 can obtain a fingerprint of the finger 60 touching the display portion 81b and execute fingerprint authentication. Accordingly, the user can unconsciously execute an authentication operation at the same time when the user performs an action of holding the electronic device 80. Therefore, at the point when the user takes the electronic device 80 in the hand and turns the eyes to the screen, the authentication has already been finished, the user has logged in the electronic device, and the electronic device is ready to use. Thus, the electronic device can be highly safe and convenient.

Furthermore, when the display portion 81a is touched by the finger 60 as illustrated in FIG. 11B, user's biological data can be obtained from the finger 60. For example, capturing of an image of the shape of a vein and capturing of an image of an arteriole can be executed.

From the data of the captured image, various biological data such as a pulse or an oxygen concentration can be obtained.

When the finger 60 touches the display portion 81b as illustrated in FIG. 11C, the display portion 81b can also obtain similar biological data.

Biological data can be obtained when the user executes an application for obtaining and managing biological data, for example. With the application, the electronic device 80 can recognize a touch of the finger 60 on the display portion 81*a* or the display portion 81*b* and execute image capturing. Moreover, the above-described biological data can be obtained from the captured image, and storage, management, or the like of the data can be executed.

An electronic device 80*a* illustrated in FIG. 12 includes a display portion 81*c* in addition to the display portion 81*a* and the display portion 81*b*. The display portion 81*c* is positioned on the side opposite to the display portion 81*b* with the display portion 81*a* therebetween.

As illustrated in FIG. 12, the display portion 81*c* is provided at a position that is naturally touched by at least one of an index finger, a middle finger, a ring finger, and a little finger of five fingers 60 when the user grasps the electronic device 80*a* with the hand 60*a*. In addition, the display portion 81*b* is provided at a position that is naturally touched by a thumb. The display portion 81*b* and the display portion 81*c* can each execute fingerprint image capturing. This enables fingerprint authentication to be executed with multiple fingerprints of fingertips and thus is preferable for authentication with higher accuracy.

Furthermore, the electronic device 80*a* has a symmetrical structure, which is preferable because the electronic device can be handled with both hands, i.e., with either a right hand or a left hand.

Structure Example 2

FIG. 13 illustrates a schematic diagram of an electronic device 80*b*. The electronic device 80*b* can be used as a tablet terminal. The electronic device 80*b* includes at least a housing 82, the display portion 81*a*, and the display portion 81*b*. The display portion 81*a* and the display portion 81*b* include a display device of one embodiment of the present invention.

When the hand 60*a* of the user is held over or touches the display portion 81*a* or the display portion 81*b*, the electronic device 80*b* can execute personal authentication and obtain biological data of the user.

When the hand 60*a* of the user is put on the display portion 81 a or the display portion 81*b*, the electronic device 80*b* can recognize the shape. Then, biological data suitable for regions corresponding to the respective parts of the hand 60*a* is obtained. For example, in regions 85*a* corresponding to fingertips of the hand 60*a*, image capturing of the shapes of fingerprints and veins can be executed. In addition, in regions 85*b* corresponding to balls of fingers, image capturing of the shapes of veins and arterioles can be executed, for example. Moreover, in a region 85*c* corresponding to a palm, image capturing of a palm print, a vein, an arteriole, and a dermis can be executed, for example. The images of the fingerprints, the palm print, and the veins can be used for personal authentication. Furthermore, the images of the arterioles, the veins, and the dermis can be used to obtain biological data.

When biological data is to be obtained, an image imitating the shape of a hand may be displayed on the display portion 81*a* or the display portion 81*b* to urge the user to put the hand 60*a* on the image. This can improve the recognition accuracy of the shape of the hand 60*a*.

In this manner, the biological data of the user can be obtained every time personal authentication for starting up the electronic device 80*b* is executed. Thus, the biological data can be accumulated continuously with the user being unconscious, which enables continuous health management to be performed. The above is preferable because the user need not execute application software or the like for health management each time, and obtainment and update of the biological data are not stopped.

Structure Example of System

With one embodiment of the present invention, a variety of biological data can be obtained regularly and continuously, and such biological data can be utilized for personal authentication, health management, or the like.

Examples of biological data that can be obtained using visible light and infrared rays include data on a fingerprint, a palm print, the shape of a vein, a pulse wave, the respiration rate, a pulse, oxygen saturation, the blood sugar level, the neutral fat concentration, and the like. Other examples include data on facial expression, complexion, a pupil, a voiceprint, and the like. It is preferable to use such a variety of biological data to comprehensively determine the user's health conditions.

As a personal authentication method using biological data, a pattern matching method is typically given. For example, feature values such as the coordinates of a plurality of characteristic points and a vector between the coordinates of those points are calculated from an image of a fingerprint, a palm print, the shape of a vein, or the like and compared with feature values of a user obtained in advance, whereby authentication can be performed. When two or more images out of the images of a fingerprint, a palm print, and the shape of a vein are used, authentication can be executed with high accuracy.

Furthermore, machine learning may be used for personal authentication using biological data or determination of health conditions. As a learning model used for machine learning, a learning model in which learning has been performed in advance may be used, or a learning model in which an update is performed using the obtained data on a user may be used. Examples of the machine learning method include supervised machine learning and unsupervised machine learning A structure example of a system of one embodiment of the present invention and an operation example of the system are described below with reference to drawings.

FIG. 14 is a block diagram of a system 90 provided with the display device of one embodiment of the present invention. The system 90 includes an arithmetic portion 91, a memory portion 92, an input portion 93, an output portion 94, a bus line 95, and the like. The system 90 can be used in a variety of electronic devices including a display portion, such as the above-described electronic device 80.

The arithmetic portion 91 is connected to the memory portion 92, the input portion 93, the output portion 94, and the like via the bus line 95 and has a function of totally controlling these components.

The memory portion 92 has a function of storing data, a program, or the like. The arithmetic portion 91 reads a program or data from the memory portion 92 and executes or processes the program or data, whereby various components included in the input portion 93 and the output portion 94 can be controlled.

As the input portion 93, a variety of sensor devices can be used. Here, a photosensor 93*a*, a camera 93*b*, a microphone 93*c*, an electrocardiogram monitor 93*d*, and the like are illustrated as components included in the input portion 93. As the photosensor 93*a*, a sensor that uses a light-receiving element included in the above-described display device can be used. The electrocardiogram monitor 93*d* has a structure including a pair of electrodes for measuring an electrocardiogram and a measuring device that measures a voltage between the electrodes, the value of current flowing between the electrodes, or the like, for example.

The output portion 94 has a function of supplying various data to the user. Illustrated here is an example including a display 94*a*, a speaker 94*b*, a vibration device 94*c*, and the like as components included in the output portion 94.

Since the display device of one embodiment of the present invention includes light-receiving elements functioning as photosensors and light-emitting elements forming a display portion, the display device can serve as both the photosensor 93*a* of the input portion 93 and the display 94*a* of the output portion 94, which are illustrated in FIG. 14. In other words, the system 90 can be formed by the structure including the display device, the arithmetic portion 91, and the memory portion 92.

For example, the display device has a function of obtaining biological data on a fingerprint, a palm print, a vein, or the like of a user, and the arithmetic portion 91 can execute fingerprint authentication, palm print authentication, or vein authentication on the basis of biological data on the user stored in advance in the memory portion 92 and the obtained biological data.

An example of an operation method of the system of one embodiment of the present invention is described below. Here, an operation of executing biometric authentication is described.

FIG. 15 is a flow chart of the operation method of the system. The flow chart in FIG. 15 includes Step S0 to Step S8.

In Step S0, the operation starts.

In Step S1, whether to execute start-up of the system is determined. For example, when power-on of the electronic device, a touch on the display portion, a change in the attitude of the electronic device, or the like is sensed, execution of start-up of the system is determined. In contrast, in the case where they are not sensed, the operation goes to Step S8 and is finished.

In Step S2, whether authentication is necessary is determined. In the case where authentication has been executed and the system is in a log-in state, it is determined that authentication is unnecessary and the operation goes to Step S7. In contrast, in the case where it is in a log-off state, it is determined that authentication is necessary and the operation goes to Step S3.

In Step S3, whether to sense an authentication operation is determined. For example, in the case where a touch of a finger, a palm, or the like of a user on part of the display portion is sensed, it is determined that the authentication operation has been sensed and the operation goes to Step S4. In contrast, in the case where it is not sensed for a certain time, the operation goes to Step S8 and is finished.

In Step S4, authentication data is obtained. For example, an image of a fingerprint, a palm print, a vein, or the like of a user is captured, and the obtainment of biological data from the captured image is executed.

In Step S5, whether authentication is correctly performed is determined. For example, the data on the fingerprint, the palm print, or the vein obtained in Step S4 and biological data on the user registered in advance are compared with each other, and whether they match each other is determined. The determination can be performed by an authentication method that does not use a machine learning model, such as a pattern matching method, or authentication using a machine learning model. In the case where authentication is correctly performed, the operation goes to Step S6. In the case where authentication is not performed correctly, the log-off state is maintained and the operation goes back to Step S4.

In Step S6, logging in to the system is executed.

In Step S7, the log-in state is maintained. In the case where the user performs an end operation or where no input for a certain period is sensed, for example, Step S7 finishes and the operation goes to Step S8.

In Step S8, the operation is finished. At least a log-off state is made in Step S8. Furthermore, the state may be a non-energized state, a standby state, or a sleep state. The operation may come back from Step S8 by the operation sensed in Step S1 described above.

Here, in the case where the operation method is applied to the electronic device 80 illustrated in FIG. 11A or the electronic device 80*a* illustrated in FIG. 12, sensing of the authentication operation in Step S3 and the obtainment of authentication data in Step S4, which are described above, can be executed by a touch of a fingertip on the display portion 81*b* or the display portion 81*c* as illustrated in FIG. 11A and FIG. 12. Furthermore, as the biological data obtained in Step S4, an image of a fingerprint or the like obtained by image capturing of light reflected by the fingertip by the light-receiving elements included in the display portion 81*b* or the display portion 81*c* can be used.

In other words, when a user's finger touches the display portion 81*b* or the display portion 81*c* in the electronic device of one embodiment of the present invention (e.g., the electronic device 80 or the electronic device 80*a*), the arithmetic portion 91 can execute a fingerprint authentication operation with a fingerprint image obtained when the light-receiving elements included in the display portion 81*b* or the display portion 81*c* captures an image of light reflected by the finger. Accordingly, the user can execute an authentication operation while he or she is unaware of it, and an electronic device that is convenient and highly safe can be achieved.

The above is the description of the structure example and the operation example of the system of one embodiment of the present invention.

Embodiment 3

In this embodiment, pixel configurations that can be used for the display device of one embodiment of the present invention are described with reference to drawings.

A display panel of one embodiment of the present invention includes first pixel circuits including a light-receiving element and second pixel circuits including a light-emitting element. The first pixel circuits and the second pixel circuits are each arranged in a matrix. FIG. 16A illustrates an example of the first pixel circuit including a light-receiving element. FIG. 16B illustrates an example of the second pixel circuit including a light-emitting element.

A pixel circuit PIX1 illustrated in FIG. 16A includes a light-receiving element PD, a transistor M1, a transistor M2, a transistor M3, a transistor M4, and a capacitor C1. Here, an example in which a photodiode is used as the light-receiving element PD is illustrated.

A cathode of the light-receiving element PD is electrically connected to a wiring V1, and an anode thereof is electrically connected to one of a source and a drain of the transistor M1. A gate of the transistor M1 is electrically connected to a wiring TX, and the other of the source and the drain thereof is electrically connected to one electrode of the capacitor C1, one of a source and a drain of the transistor M2, and a gate of the transistor M3. A gate of the transistor M2 is electrically connected to a wiring RES, and the other of the source and the drain thereof is electrically connected to a wiring V2. One of a source and a drain of the transistor M3 is electrically connected to a wiring V3, and the other of the source and the drain thereof is electrically connected to one of a source and a drain of the transistor M4. A gate of the transistor M4 is electrically connected to a wiring SE, and the other of the source and the drain thereof is electrically connected to a wiring OUT1.

A constant potential is supplied to the wiring V1, the wiring V2, and the wiring V3. When the light-receiving element PD is driven with a reverse bias, a potential lower than the potential of the wiring V1 is supplied to the wiring V2. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the potential of the node changes, in accordance with a current flowing through the light-receiving element PD. The transistor M3 functions as an amplifier transistor for performing output in response to the potential of the node. The transistor M4 is controlled by a signal supplied to the wiring SE and functions as a selection transistor for reading an output corresponding to the potential of the node by an external circuit connected to the wiring OUT1.

A pixel circuit PIX2 illustrated in FIG. 16B includes a light-emitting element EL, a transistor M5, a transistor M6, a transistor M7, and a capacitor C2. Here, an example in which a light-emitting diode is used as the light-emitting element EL is illustrated. In particular, an organic EL element is preferably used as the light-emitting element EL.

A gate of the transistor M5 is electrically connected to a wiring VG, one of a source and a drain thereof is electrically connected to a wiring VS, and the other of the source and the drain thereof is electrically connected to one electrode of the capacitor C2 and a gate of the transistor M6. One of a source and a drain of the transistor M6 is electrically connected to a wiring V4, and the other thereof is electrically connected to an anode of the light-emitting element EL and one of a source and a drain of the transistor M7. A gate of the transistor M7 is electrically connected to a wiring MS, and the other of the source and the drain thereof is electrically connected to a wiring OUT2. A cathode of the light-emitting element EL is electrically connected to a wiring V5.

A constant potential is supplied to the wiring V4 and the wiring V5. In the light-emitting element EL, the anode side can have a high potential and the cathode side can have a lower potential than the anode side. The transistor M5 is controlled by a signal supplied to the wiring VG and functions as a selection transistor for controlling a selection state of the pixel circuit PIX2. The transistor M6 functions as a driving transistor that controls a current flowing through the light-emitting element EL, in accordance with a potential supplied to the gate. When the transistor M5 is in an on state, a potential supplied to the wiring VS is supplied to the gate of the transistor M6, and the emission luminance of the light-emitting element EL can be controlled in accordance with the potential. The transistor M7 is controlled by a signal supplied to the wiring MS and has a function of outputting a potential between the transistor M6 and the light-emitting element EL to the outside through the wiring OUT2.

Note that in the display panel of this embodiment, the light-emitting element may be made to emit light in a pulsed manner so as to display an image. A reduction in the driving time of the light-emitting element can reduce the power consumption of the display panel and suppress heat generation of the display panel. An organic EL element is particularly preferable because of its favorable frequency characteristics. The frequency can be higher than or equal to 1 kHz and lower than or equal to 100 MHz, for example.

Here, a transistor using a metal oxide (an oxide semiconductor) in a semiconductor layer where a channel is formed is preferably used as the transistor M1, the transistor M2, the transistor M3, and the transistor M4 included in the pixel circuit PIX1 and the transistor M5, the transistor M6, and the transistor M7 included in the pixel circuit PIX2.

A transistor using a metal oxide having a wider band gap and a lower carrier density than silicon can achieve an extremely low off-state current. Thus, such a low off-state current enables retention of charge accumulated in a capacitor that is connected in series with the transistor for a long time. Therefore, it is particularly preferable to use a transistor using an oxide semiconductor as the transistor M1, the transistor M2, and the transistor M5 each of which is connected in series with the capacitor C1 or the capacitor C2. Moreover, the use of transistors using an oxide semiconductor as the other transistors can reduce the manufacturing cost.

Alternatively, transistors using silicon as a semiconductor in which a channel is formed can be used as the transistor M1 to the transistor M7. In particular, the use of silicon with high crystallinity, such as single crystal silicon or polycrystalline silicon, is preferable because high field-effect mobility is achieved and higher-speed operation is possible.

Alternatively, a transistor using an oxide semiconductor may be used as one or more of the transistor M1 to the transistor M7, and transistors using silicon may be used as the other transistors.

Although n-channel transistors are illustrated as the transistors in FIG. 16A and FIG. 16B, p-channel transistors can alternatively be used.

The transistors included in the pixel circuit PIX1 and the transistors included in the pixel circuit PIX2 are preferably formed side by side over the same substrate. It is particularly preferable that the transistors included in the pixel circuit PIX1 and the transistors included in the pixel circuit PIX2 be periodically arranged in one region.

One or more layers including one or both of the transistor and the capacitor are preferably provided to overlap with the light-receiving element PD or the light-emitting element EL. Thus, the effective area of each pixel circuit can be reduced, and a high-resolution light-receiving portion or display portion can be achieved.

At least part of this embodiment can be implemented in combination with the other embodiments described in this specification as appropriate.

Embodiment 4

In this embodiment, electronic devices for which the display device of one embodiment of the present invention can be used are described with reference to drawings.

An electronic device in this embodiment includes the display device of one embodiment of the present invention. The display device has a function of detecting light, and thus can perform biometric authentication on the display portion and detect a touch or a near touch on the display portion. Unauthorized use of the electronic device of one embodiment of the present invention is difficult, that is, the electronic device has extremely high security level. Moreover, the electronic device can have improved functionality or convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

An electronic device 6500 illustrated in FIG. 17A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function. The display device of one embodiment of the present invention can be used in the display portion 6502.

FIG. 17B is a schematic cross-sectional view including an end portion of the housing 6501 on the microphone 6506 side.

A protection member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted with the thickness of the electronic device controlled. An electronic device with a narrow frame can be achieved when part of the display panel 6511 is folded back so that the portion connected to the FPC 6515 is provided on the rear side of a pixel portion.

FIG. 18A illustrates an example of a television device. In a television device 7100, a display portion 7000 is incorporated in a housing 7101. Here, a structure in which the housing 7101 is supported by a stand 7103 is illustrated.

A display device of one embodiment of the present invention can be used in the display portion 7000.

Operation of the television device 7100 illustrated in FIG. 18A can be performed with an operation switch provided in the housing 7101, a separate remote controller 7111, or the like. Alternatively, the display portion 7000 may include a touch sensor, and the television device 7100 may be operated by a touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed. FIG. 18B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000.

FIG. 18C and FIG. 18D illustrate examples of digital signage.

Digital signage 7300 illustrated in FIG. 18C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 18D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 18C and FIG. 18D.

A larger area of the display portion 7000 can increase the amount of data that can be provided at a time. The larger display portion 7000 attracts more attention, so that the advertising effectiveness can be enhanced, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 18C and FIG. 18D, the digital signage 7300 or the digital signage 7400 is preferably capable of working with an information terminal 7311 or an information terminal 7411 such as a user's smartphone through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIG. 19A to FIG. 19F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 19A to FIG. 19F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image, a moving image, or the like and storing the taken image in a recording medium (an external recording medium or a recording medium incorporated in the camera), a function of displaying the taken image on the display portion, or the like.

The details of the electronic devices illustrated in FIG. 19A to FIG. 19F are described below.

FIG. 19A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters, image information, or the like on its plurality of surfaces. FIG. 19A illustrates an example in which three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

FIG. 19B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, a user can check the information 9053 displayed at a position that can be observed from above the portable information terminal 9102, with the portable information terminal 9102 put in a breast pocket of his/her clothes. The user can see the display without taking out the portable information terminal 9102 from the pocket and decide whether to answer the call, for example.

FIG. 19C is a perspective view illustrating a watch-type portable information terminal 9200. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal or charging. Note that the charging operation may be performed by wireless power feeding.

FIG. 19D, FIG. 19E, and FIG. 19F are perspective views illustrating a foldable portable information terminal 9201. FIG. 19D is a perspective view of an opened state of the portable information terminal 9201, FIG. 19F is a perspective view of a folded state thereof, and FIG. 19E is a perspective view of a state in the middle of change from one of FIG. 19D and FIG. 19F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be curved with a radius of curvature greater than or equal to 0.1 mm and less than or equal to 150 mm.

At least part of this embodiment can be implemented in combination with the other embodiments described in this specification as appropriate.

REFERENCE NUMERALS

10: display device, 11: substrate, 12: substrate, 21B: light-emitting element, 21G: light-emitting element, 21R: light-emitting element, 21: light-emitting element, 22: light-receiving element, 23IR: light-emitting element, 23: light-emitting element, 24: light-blocking layer, 31: resin layer, 32: resin layer, 50: display device, 51: layer, 52*a*: layer, 52*b*: layer, 52*c*: layer, 52: layer, 60*a*: hand, 60: finger, 71: pixel, 72: pixel, 73: pixel, 75*a*: circuit portion, 75*b*: circuit portion, 76*a*: circuit portion, 76*b*: circuit portion, 77: circuit portion, 78: circuit portion, 79*a*: circuit portion, 79*b*: circuit portion, 79*c*: circuit portion, 79*d*: circuit portion, 80*a*: electronic device, 80*b*: electronic device, 80: electronic device, 81*a*: display portion, 81*b*: display portion, 81*c*: display portion, 81: display portion, 82: housing, 85*a*: region, 85*b*: region, 85*c*: region, 90: system 91: arithmetic portion, 92: memory portion, 93*a*: photosensor, 93*b*: camera, 93*c*: microphone, 93*d*: electrocardiogram monitor, 93: input portion, 94*a*: display, 94*b*: speaker, 94*c*: vibration device, 94: output portion, 95: bus line, 100A: display device, 100B: display device, 100: display device, 110: light-receiving element, 111: pixel electrode, 112: photoelectric conversion layer, 113: common electrode, 114: common layer, 115: common layer, 116: active layer, 121: light, 122: light, 123: light, 131: transistor, 132: transistor, 141: resin layer, 142: resin layer, 145: light-blocking layer, 151: substrate, 152: substrate, 160: light-emitting element, 161: electrode, 162: EL layer, 163: electrode, 164: buffer layer, 165: buffer layer, 166: light-emitting layer, 167: conductive layer, 190: light-emitting element, 191: pixel electrode, 192: EL layer, 195*a*: inorganic insulating layer, 195*b*: organic insulating layer, 195*c*: inorganic insulating layer, 195: protective layer, 196: light-emitting layer, 200: display device, 202: transistor, 204: connection portion, 208: transistor, 209: transistor, 210:

transistor, 211: insulating layer, 214: insulating layer, 215: insulating layer, 216: partition, 217: insulating layer, 218: insulating layer, 221: conductive layer, 222*a*: conductive layer, 222*b*: conductive layer, 223: conductive layer, 225: insulating layer, 228: region, 231*i*: channel formation region, 231*n*: resistance region, 231: semiconductor layer, 242: connection layer, 262: display portion, 264: circuit, 265: wiring, 266: conductive layer, 270B: light-emitting element, 270G: light-emitting element, 270PD: light-receiving element, 270R: light-emitting element, 270SR: light-emitting and light-receiving element, 271: pixel electrode, 272: FPC, 273: active layer, 274: IC, 275: common electrode, 277: first electrode, 278: second electrode, 280A: display device, 280B: display device, 280C: display device, 281: hole-injection layer, 282: hole-transport layer, 283B: light-emitting layer, 283G: light-emitting layer, 283R: light-emitting layer, 283: light-emitting layer, 284: electron-transport layer, 285: electron-injection layer, 289: layer

The invention claimed is:

1. A display device comprising:
a first substrate;
a plurality of first light-emitting elements;
a plurality of second light-emitting elements;
a plurality of light-receiving elements;
a light-blocking layer;
a first resin layer; and
a second resin layer,
wherein the plurality of first light-emitting elements and the plurality of light-receiving elements are over the first substrate,
wherein the first resin layer is over the plurality of first light-emitting elements and the plurality of light-receiving elements,
wherein the light-blocking layer is over the first resin layer,
wherein the plurality of second light-emitting elements is over the light-blocking layer,
wherein the second resin layer is over the plurality of second light-emitting elements,
wherein each of the plurality of first light-emitting elements is configured to emit visible light toward the second resin layer,
wherein each of the plurality of second light-emitting elements is configured to emit invisible light toward the second resin layer,
wherein each of the plurality of light-receiving elements is a photoelectric conversion element having sensitivity to the visible light and the invisible light,
wherein in a plan view, the light-blocking layer comprises a portion between one of the plurality of first light-emitting elements and one of the plurality of light-receiving elements and a portion between another of the plurality of first light-emitting elements and another of the plurality of light-receiving elements,
wherein in a cross-sectional view, each of the plurality of second light-emitting elements overlaps with the light-blocking layer, and
wherein two adjacent second light-emitting elements of the plurality of second light-emitting elements are electrically connected with each other by a conductive layer.

2. The display device according to claim 1,
wherein one of the two adjacent second light-emitting elements comprises a first island-shaped electrode,
wherein the other of the two adjacent second light-emitting elements comprises a second island-shaped electrode, and wherein the first island-shaped electrode and the second island-shaped electrode are electrically connected with each other by the conductive layer.

3. The display device according to claim 1,
wherein the invisible light is light having intensity in a wavelength range of greater than or equal to 750 nm and less than or equal to 900 nm.

4. The display device according to claim 1,
wherein the one of the plurality of first light-emitting elements comprises a first pixel electrode, a first light-emitting layer, and a first electrode,
wherein the one of the plurality of light-receiving elements comprises a second pixel electrode, an active layer, and the first electrode,
wherein the first light-emitting layer and the active layer contain different organic compounds from each other,
wherein the first electrode comprises a portion overlapping with the first pixel electrode with the first light-emitting layer therebetween and a portion overlapping with the second pixel electrode with the active layer therebetween, and
wherein the first pixel electrode and the second pixel electrode contain the same conductive material.

5. A display module comprising:
the display device according to claim 1; and
a connector or an integrated circuit.

6. An electronic device comprising:
the display module according to claim 5; and
at least one of an antenna, a battery, a housing, a camera, a speaker, a microphone, a touch sensor, and an operation button.

7. The electronic device according to claim 6,
wherein the electronic device is configured to receive first reflective light by the one of the plurality of light-receiving elements when the visible light is emitted by the one of the plurality of first light-emitting elements, and
wherein the electronic device is configured to receive second reflective light by the one of the plurality of light-receiving elements when the invisible light is emitted by the one of the plurality of second light-emitting elements.

8. A display device comprising:
a first substrate;
a plurality of first light-emitting elements;
a plurality of second light-emitting elements;
a plurality of light-receiving elements;
a light-blocking layer;
a first resin layer; and
a second resin layer,
wherein the plurality of first light-emitting elements and the plurality of light-receiving elements are over the first substrate,
wherein the first resin layer is over the plurality of first light-emitting elements and the plurality of light-receiving elements,
wherein the light-blocking layer is over the first resin layer,
wherein the plurality of second light-emitting elements is over the light-blocking layer,
wherein the second resin layer is over the plurality of second light-emitting elements,
wherein each of the plurality of first light-emitting elements is configured to emit visible light toward the second resin layer, wherein each of the plurality of second light-emitting elements is configured to emit invisible light toward the second resin layer, wherein each of the plurality of light-receiving elements is a photoelectric conversion element having sensitivity to the visible light and the invisible light, wherein in a plan view, the light-blocking layer comprises a portion between one of the plurality of first light-emitting elements and one of the plurality of light-receiving elements and a portion between another of the plurality of first light-emitting elements and another of the plurality of light-receiving elements, and wherein in a cross-sectional view, each of the plurality of second light-emitting elements overlaps with the light-blocking layer.

9. The display device according to claim 8, wherein one of the two adjacent second light-emitting elements comprises a first island-shaped electrode, wherein the other of the two adjacent second light-emitting elements comprises a second island-shaped electrode, and wherein the first island-shaped electrode and the second island-shaped electrode are electrically connected with each other.

10. The display device according to claim 8, wherein the invisible light is light having intensity in a wavelength range of greater than or equal to 750 nm and less than or equal to 900 nm.

11. The display device according to claim 8, wherein the one of the plurality of first light-emitting elements comprises a first pixel electrode, a first light-emitting layer, and a first electrode, wherein the one of the plurality of light-receiving elements comprises a second pixel electrode, an active layer, and the first electrode, wherein the first light-emitting layer and the active layer contain different organic compounds from each other, wherein the first electrode comprises a portion overlapping with the first pixel electrode with the first light-emitting layer therebetween and a portion overlapping with the second pixel electrode with the active layer therebetween, and wherein the first pixel electrode and the second pixel electrode contain the same conductive material.

12. A display module comprising:

the display device according to claim 8; and a connector or an integrated circuit.

13. An electronic device comprising:

the display module according to claim 12; and at least one of an antenna, a battery, a housing, a camera, a speaker, a microphone, a touch sensor, and an operation button.

14. The electronic device according to claim 13, wherein the electronic device is configured to receive first reflective light by the one of the plurality of light-receiving elements when the visible light is emitted by the one of the plurality of first light-emitting elements, and wherein the electronic device is configured to receive second reflective light by the one of the plurality of light-receiving elements when the invisible light is emitted by the one of the plurality of second light-emitting elements.

* * * * *